United States Patent
Matei et al.

(10) Patent No.: US 11,544,422 B2
(45) Date of Patent: Jan. 3, 2023

(54) MACHINE LEARNING BASED SYSTEMS AND METHODS FOR REAL TIME, MODEL BASED DIAGNOSIS

(71) Applicant: Palo Alto Research Center Incorporated, Palo Alto, CA (US)

(72) Inventors: Ion Matei, Sunnyvale, CA (US); Maksym Zhenirovskyy, Mountain View, CA (US); Johan de Kleer, Los Altos, CA (US); Alexander Feldman, Santa Cruz, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 455 days.

(21) Appl. No.: 16/572,280

(22) Filed: Sep. 16, 2019

(65) Prior Publication Data
US 2021/0081511 A1  Mar. 18, 2021

(51) Int. Cl.
*G06F 30/17* (2020.01)
*G06F 17/16* (2006.01)
(Continued)

(52) U.S. Cl.
CPC .............. *G06F 30/17* (2020.01); *G06F 17/13* (2013.01); *G06F 17/16* (2013.01); *G06F 30/20* (2020.01); *G06K 9/6256* (2013.01); *G06N 5/022* (2013.01)

(58) Field of Classification Search
CPC .......... G06F 30/17; G06F 17/13; G06F 17/16; G06F 30/20; G06F 30/27; G06F 11/2263; G06F 19/00; G06K 9/6256; G06K 9/6271; G06N 5/022; G06N 5/003; G06N 3/08; G06N 30/02; G06N 3/0454; G06V 10/82; B60L 3/0092; B60T 7/12; E21B 45/00; G05B 23/024; G05B 19/4183; G06Q 10/0639; G06Q 50/30
See application file for complete search history.

(56) References Cited

U.S. PATENT DOCUMENTS 3,938,765 A * 2/1976 Cope .................. B60T 7/12
246/172
5,210,704 A * 5/1993 Husseiny ............. G05B 23/024
702/34

(Continued)

FOREIGN PATENT DOCUMENTS

CN  102208028 A * 10/2011
CN  102575516 A * 7/2012 ............. E21B 45/00

(Continued)

OTHER PUBLICATIONS

US 2016/0306725, see short version, Oct. 2016.*
(Continued)

*Primary Examiner* — Kandasamy Thangavelu
(74) *Attorney, Agent, or Firm* — Fay Sharpe LLP

(57) ABSTRACT

The disclosure following relates generally to complex simulations, and fault diagnosis. In some embodiments, a component that is causing a delayed simulation time of a system is determined. A component of reduced complexity is designed, and the component of reduced complexity is used to replace the original component in the system. Fault diagnosis may then be conducted using the updated system with the reduced complexity component, thus decreasing the time taken to diagnose the fault.

17 Claims, 23 Drawing Sheets

(51) Int. Cl.
    *G06N 5/02*     (2006.01)
    *G06F 17/13*     (2006.01)
    *G06K 9/62*     (2022.01)
    *G06F 30/20*     (2020.01)

(56) References Cited

U.S. PATENT DOCUMENTS

| | | | | |
|---|---|---|---|---|
| 10,089,204 | B2* | 10/2018 | Hare | G06F 11/07 |
| 2004/0148940 | A1* | 8/2004 | Venkateswaran | F01D 17/085 60/772 |
| 2016/0306725 | A1* | 10/2016 | Hare | G06F 11/2263 |

FOREIGN PATENT DOCUMENTS

| | | | | | |
|---|---|---|---|---|---|
| CN | 103822793 | A | * | 5/2014 | |
| CN | 104408247 | A | * | 3/2015 | |
| CN | 206704212 | U | * | 12/2017 | |
| CN | 108345966 | A | * | 7/2018 | G06Q 10/0639 |
| CN | 109670595 | A | * | 4/2019 | G06N 3/02 |
| CN | 109815983 | A | * | 5/2019 | |
| CN | 209085657 | U | * | 7/2019 | G05B 19/4183 |
| CN | 110163385 | A | * | 8/2019 | G06Q 50/30 |
| CN | 110222822 | A | * | 9/2019 | G06N 3/0454 |
| WO | WO2016088230 | A1 | * | 6/2017 | G06F 19/00 |
| WO | WO 2019001955 | A1 | * | 1/2019 | B60L 3/0092 |

OTHER PUBLICATIONS

Abobghala et al., "Evaluation of passive and active steering systems for railway vehicles using MatLab and Simulink simulation", 23rd International Conference on Automation& Computing, 2017.*
U.S. Pat. No. 5,210,704, See short version, May 1993.*
U.S. Pat. No. 3,938,765 A, see the short version, Feb. 1976.*
Chymera et al., "Simplified power converter for integrated traction energy storage", IEEE, 2011.*
M. Sanjeev Arulampalam, Simon Maskell, and Neil Gordon. A tutorial on particle filters for online nonlinear/non-gaussian bayesian tracking. IEEE Transactions On Signal Processing, 50:174 188, 2002.
T. Blochwitz, M. Otter, M. Arnold, C. Bausch, C. Claus, H. Elmqvist, A. Junghanns, J. Mauss, M. Monteiro, T. Neidhold, D. Neumerkel, H. Olsson, J. v. Peetz, S. Wolf, Atego Systems Gmbh, Qtronic Berlin, Fraunhofer Scai, and St. Augustin. The functional mockup interface for tool independent exchange of simulation models. In In Proceedings of the 8th International Modelica Conference, 2011.
Francesco Casella. Introduction to the Dynamic Modelling of Thermo-Fluid Systems using Modelica—mini course, Mar. 2011.
Francois Chollet et al. Keras. https://keras.io, 2015.
J. de Kleer, A. Mackworth, and R. Reiter. Characterizing diagnoses and systems. "Journal of Artificial Inteligence", 56(2-3):197-222, 1992.
Martin Abadi et al. TensorFlow: Large-scale machine learning on heterogeneous systems, 2015. Software available from tensorflow. org.
Peter Fritzson. Principles of Object-Oriented Modeling and Simulation with Modelica 3.3: A Cyber-Physical Approach. IEEE Press. Wiley, Hoboken, NJ, 2 edition, 2015.
J. Gertler. Fault-Detection and Diagnosis in Engineering Systems. New York: Marcel Dekker, 1998.
T. Honda, E. Saund, I. Matei, B. Janssen, B. Saha, D. G. Bobrow, J. de Kleer, T. Kurtoglu, and Z. Lattmann. A simulation and modeling based reliability requirements assessment methodology. In Proceedings of International Design Engineering Technical Conferences and Computers and Information in Engineering Conference (ASME 2014), vol. 7, Aug. 2014.
Rolf Isermann. Model-based fault-detection and diagnosis—status and applications. Annual Reviews in Control, 29(1):71-85, 2005.
R.E. Kalman. A new approach to linear filtering and prediction problems. Transactions of the ASME—Journal of Basic Engineering, 82(Series D):35-45, 1960.
R. Minhas, J. de Kleer, I. Matei, B. Saha, B. Janssen, D.G. Bobrow, and T. Kurtoglu. Using fault augmented modelica models for diagnostics. In Proceedings of the 10th International ModelicaConference, pp. 437-445, 2014.
Dragan D. Nikolic. Dae tools: equation-based object-oriented modelling, simulation and optimisation software. PeerJ Computer Science, 2:e54, Apr. 2016.
Adam Paszke, Sam Gross, Soumith Chintala, Gregory Chanan, Edward Yang, Zachary DeVito, Zeming Lin, Alban Desmaison, Luca Antiga, and Adam Lerer. Automatic differentiation in pytorch. 2017.
Ron J. Patton, Paul M. Frank, and Robert N. Clark. Issues of Fault Diagnosis for Dynamic Systems. Springer-Verlag London, 2000.
B. Saha, T. Honda, I. Matei, E. Saund, J. de Kleer, W. C. Janssen, T. Kurtoglu, and D. G Bobrow. Model-based approach for optimal maintenance strategy. In Proceedings of Second European Conference of the Prognostics and Health Management Society, Aug. 2014.
A.J. van der Schaft and D. Jeltsema. Port-hamiltonian systems theory: An introductory overview. Foundations and Trends in Systems and Control, 1(2-3):173-378, 2014.

* cited by examiner

MACHINE LEARNING BASED SYSTEMS AND METHODS FOR REAL TIME, MODEL BASED DIAGNOSIS

OUTSIDE FUNDING

This invention was made with United States Government support under contract DARPA-PAI-SUNYRF-PEA awarded by Defense Advanced Research Projects Agency (DARPA). The United States Government has certain rights in the invention.

BACKGROUND

The following relates generally to complex simulations, and fault diagnosis. Current systems, particularly those that use differential algebraic equations (DAEs), have a drawback in that they require a long simulation time. The approaches described herein overcome this drawback and others.

BRIEF DESCRIPTION

The following proposes a hybrid modeling approach for generating reduced complexity models of a high fidelity physical system model. The reduced models preserve the structural topology and the physical interpretation of their components. The reduced models are based on machine learning inspired representations for complex model components. Deep learning platforms featuring automatic differentiation are used to learn the parameters of the new representations using data generated by the original, high fidelity models. The reduction effort is focused on the system components responsible for slowing down the model simulations. The reduced models can be simulated much faster than the original higher complexity models. The reduced models are used in real time applications such as model-based control, diagnosis and prognosis, where fast simulations are required. The preservation of the system topology and of the physical interpretation enable fault augmentation techniques to be applied to the reduced models.

Typical model reduction techniques do not preserve the topological description of the system and the physical interpretation. The source of the slow simulations are not considered explicitly. A change in the use case of the system requires the application of a new model reduction process. Typical model reduction techniques deal with mostly with ordinary differential equations (ODEs) representing the system dynamics.

Advantageously, the present technique preserves topology and physical interpretations. This includes a clear path between micro- and macroscale views. The systems and methods described herein provide substantially the same functionality as the state of the art but are less computationally expensive.

Another advantage of the systems and methods described herein includes using the models for real-time, model-based diagnosis. Implementations described herein require less data as compared to machine learning based diagnosis approaches. Use case change does not require the application of a new model reduction.

By way of brief overview, a complex physical system may be described by an ODE or a differential algebraic equation (DAE). Simulating the system model over some required time interval takes tens of seconds, or several minutes. The model is used for model-based diagnosis. Particle filter based model based diagnosis requires numerous (e.g. hundreds or thousands) simultaneous simulations of the model over a predefined time horizon, and involves updates to the outputs as new real-time measurements are received. All parallel simulations need to finish before the new measurements arrive. To ensure that this happens, implementations locate the system components that slow down the simulations and learn simpler and faster representations (models). These representations are based on machine learning models (e.g., neural networks) and preserve the physical interpretation. This is achieved by maintaining the component interface. Data generated by the original, high-fidelity (e.g., the closer to the real physical system, the higher the fidelity is) model is used to learn the parameters of the new representations. Training platforms (e.g., Pytorch) featuring ODE/DAE solvers and automatic differentiation are used to learn the parameters of the new representations. This way, implementations avoid errors induced by the numerical approximations of the loss function gradients. Since the topology and the physical interpretation are preserved, some embodiments apply fault augmentation enabling the diagnosis of physics-inspired fault modes. The reduced model can be used, in addition to diagnosis, for control and prognosis, as well.

Some embodiments include extensions to prognostics and control applications. Some embodiments can be used to generate data for machine learning methods.

According one aspect illustrated herein, there is provided a device comprising: at least one processor; and at least one memory including computer program code; the at least one memory and the computer program code configured to, with the at least one processor, cause the device to: determine that a component of a first model is more complex than other components of the first model; generate training data from the first model; using the generated training data, design a reduced complexity component; generate a second model by replacing the component in the first model with the reduced complexity component; and diagnose a fault using the second model.

According to another aspect, there is provided a device comprising: at least one processor; and at least one memory including computer program code; the at least one memory and the computer program code configured to, with the at least one processor, cause the device to: determine a set of constitutive equations of a system, the constitutive equations based on generalized mass spring dampers (gMSD); learn a representation of a component of the system by solving a constrained optimization problem, wherein the constrained optimization problem is based on the determined set of constitutive equations; and determine a fault condition of the system by using the learned representation of the component.

In the device as described in the preceding paragraph, in some embodiments, the at least one memory and the computer program code may be further configured to, with the at least one processor, cause the device at least to: impose a dissipativity condition on the component, wherein the dissipativity condition: (i) ensures that the system can be simulated; and (ii) is based on an energy of the component. The constitutive equations may emulate physical laws. In some embodiments, the constitutive equations are of the form $f(x; w)=0$, where x includes port variables and internal variables, and w is a vector of parameters of the component. In some embodiments, the constrained optimization problem is a minimization problem. In some embodiments, the fault condition is determined based on a mean square error (MSE) of a given parameter. In some embodiments, the fault condition is determined based on $\|\theta_i-\theta_i^*\|\geq\varepsilon_i$, where: $\varepsilon_i$ is a fault specific threshold; $\{\theta_1, \ldots, \theta_L\}$ is a set of fault parameters; and $\theta_i^*$ are nominal values for $i\in\{1,\ldots L\}$. In some embodiments, the system is a rail switch system and the component is a rail. In some embodiments, the system is a rail switch system and the component is a rail; and the at least one memory and the computer program code are further configured to, with the at least one processor, cause the device to determine the set of constitutive equations further by using force, position, velocity and acceleration as training data.

In another aspect, there is a device comprising: at least one processor; and at least one memory including computer program code; the at least one memory and the computer program code configured to, with the at least one processor, cause the device to: use a causal map to assign causality relations between at least one input variable of a component and at least one output variable of the component by: first, training parameters of the component from training data; and second, fine tuning the parameters of the component by using a model of a system, wherein the system includes the component; and determine a fault condition of the system by using the parameters of the component.

In the device as described in the preceding paragraph, in some embodiments, the causal map uses a neural network (NN). In some embodiments, the fault condition is determined based on a mean square error (MSE) of a given parameter. In some embodiments, the system is a rail switch system and the component is a rail. In some embodiments, the system is an electrical system, and the fault condition is one of a short connection and an open connection. In some embodiments, the system is a mechanical system, and the fault condition is one of a broken flange or a stuck flange. In some embodiments, the system is a fluid system, and the fault condition is one of a blocked pipe or a leaking pipe.

Variations of the present techniques include use of filtering-based techniques to solve the regression problems that are part of the classifier training.

DETAILED DESCRIPTION

Figure 1A:
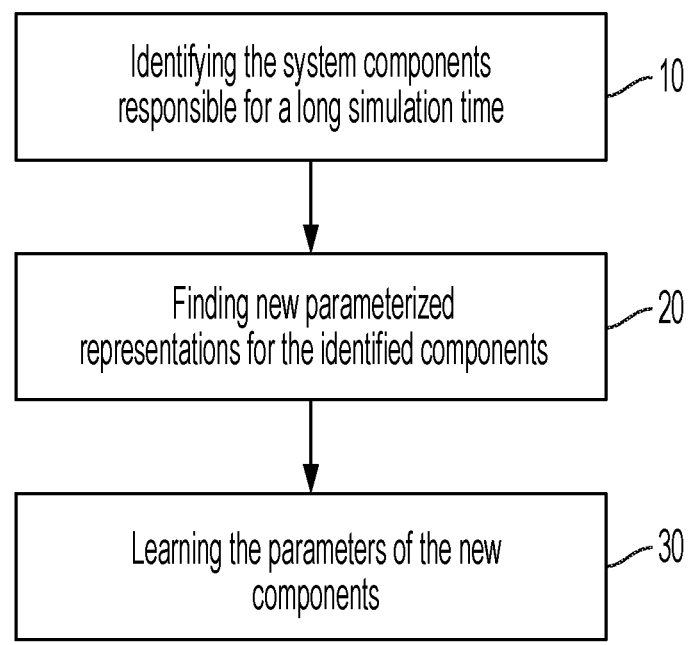
FIG. 1A shows an example overview of an embodiment.

The systems and methods described herein teach a hybrid modeling approach for generating reduced models of a high fidelity model of a physical system. Specifically, some embodiments include machine learning inspired representations for complex model components. These representations preserve in part the physical interpretation of the original components. Training platforms featuring automatic differentiation are used to learn the parameters of the new representations using data generated by the high-fidelity model. Some approaches are showcased in the context of fault diagnosis for a rail switch system. Some embodiments generate three new model abstractions whose complexities are two order of magnitude smaller than the complexity of the high fidelity model, both in the number of equations and simulation time. Faster simulations ensure a faster diagnosis solutions and enable the use of diagnosis algorithms relying heavily on a large number of model simulations.

I. INTRODUCTION

In model-based approaches, the diagnosis engine is provided with: a model of the system, nominal values of the parameters of the model, and values of some of the inputs and outputs. One goal of a diagnosis engine is to determine from only this information the presence of a fault and to isolate it. There is rich literature on model-based diagnosis results proposed independently by the artificial intelligence [J. de Kleer, A. Mackworth, and R. Reiter. Characterizing diagnoses and systems. "Journal of Artificial Intelligence", 56(2-3):197-222, 1992.] and control [J. Gertler. Fault-Detection and Diagnosis in Engineering Systems. New York: Marcel Dekker, 1998; Rolf Isermann. Model-based fault-detection and diagnosis—status and applications. Annual Reviews in Control, 29(1):71-85, 2005; Ron J. Patton, Paul M. Frank, and Robert N. Clark. Issues of Fault Diagnosis for Dynamic Systems. Springer-Verlag London, 2000.] communities. Model-based diagnosis requires accurate models to detect and isolate faults in physical systems. For real-time diagnosis, such models need to simulate within an allotted time interval. Typically, the more accurate models are, the more complex the models become, and hence it takes more time to simulate them. Traditional model-based diagnosis include filters (e.g., Kalman filter [R. E. Kalman. A new approach to linear filtering and prediction problems. Transactions of the ASME—Journal of Basic Engineering, 82(Series D):35-45, 1960.], particle filter [M. Sanjeev Arulampalam, Simon Maskell, and Neil Gordon. A tutorial on particle filters for online nonline-ar/non-gaussian bayesian tracking. IEEE TRANSACTIONS ON SIGNAL PROCESSING, 50:174-188, 2002.]), or optimization based-techniques that estimate a number of parameters whose deviation from their nominal values indicate the presence of a fault. These methods rely on model simulations either for one sample period (Kalman and particle filters) or for some time horizon (optimization based). The simulation time becomes even more stringent in the case of the particle filter where a possibly large number of particles require their own model simulations. One may argue that many systems use ordinary differential equations (ODEs) models as representations, and, these systems use a one time step forward propagation, which is not necessarily a complex operation. Although this is true for some physical systems, many others require differential algebraic equations (DAEs) as mathematical representations. DAE simulations require the use of the Newton-Rhapson algorithm that in turn requires the inversion of a Hessian matrix. The Hessian matrix size depends on the complexity of the model (e.g., number of equations and variables).

Disclosed herein is a hybrid modeling approach to reduce the complexity of a high-fidelity model of a physical system. The reduced complexity model is used by a diagnosis-engine to detect and isolate system faults. Because the model for model-based diagnosis is used, the model complexity has an effect on the simulation time. As shown in FIG. 1A, the hybrid modeling approach is based on: operation 10, identifying the system component(s) responsible for a long simulation time; operation 20, finding new parameterized representations for such components; and operation 30, learning the parameters of the new components. Some embodiments ensure that the chosen representations preserve, at least in part, the physical meaning of the original physical components. Such a meaning is particularly useful in diagnosis since it points to a physical explanation of a faulty behavior.

Figure 1B:
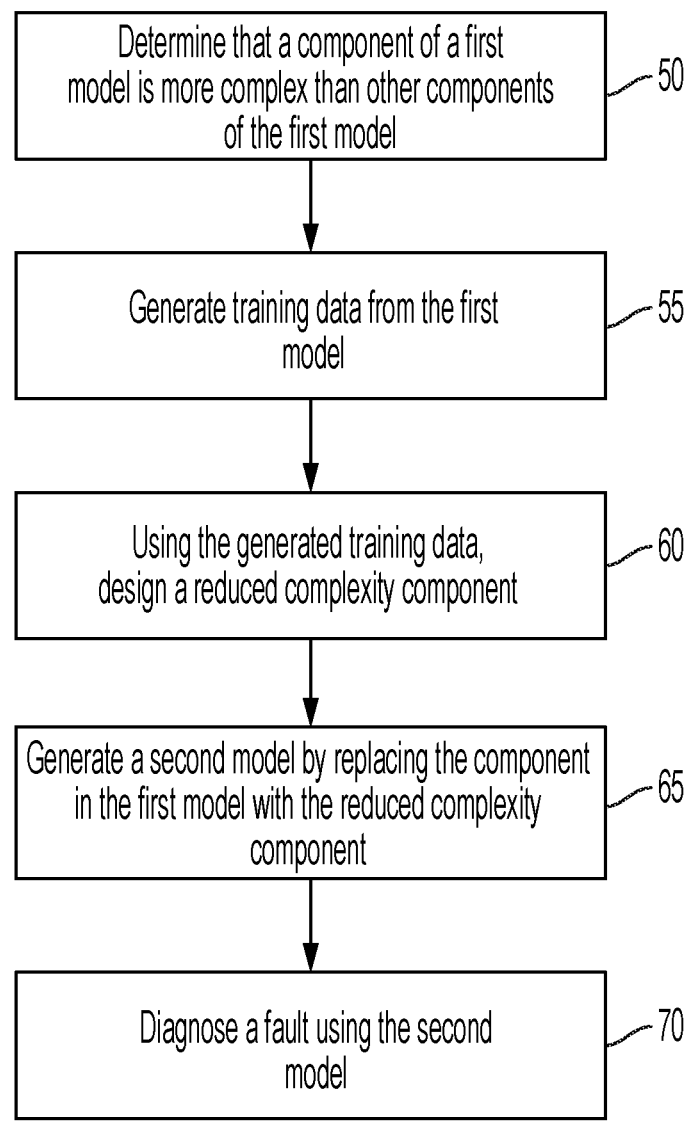
FIG. 1B shows another example overview of an embodiment.

In another example, as shown by FIG. 1B, in operation 50, it is determined that a component of a first model (e.g., the high-fidelity model) is more complex than other components of the first model. In operation 55, training data is generated from the first model. In operation 60, using the generated training data, a reduced complexity component is designed. In operation 65, a second model (e.g., a reduced complexity model) is generated by replacing the component in the first model with the reduced complexity component. In operation 70, a fault is diagnosed using the second model.

II. PROBLEM DESCRIPTION

The following considers physical systems whose behavior can be described by a set of DAEs of the form $$0 = F(\dot{x}, x, u),$$

$$y = h(x, u),$$

where x represents the state vector, u is a vector of inputs, and y is a vector of outputs. Some implementations consider parametric faults: faults that can be described through changes in system parameter values. Parametric faults do not impose significant constraints on the type of faults that can be detected and isolated.

Indeed, as shown in previous work [T. Honda, E. Saund, I. Matei, B. Janssen, B. Saha, D. G. Bobrow, J. de Kleer, T. Kurtoglu, and Z. Lattmann. A simulation and modeling based reliability requirements assessment methodolog. In Proceedings of International Design Engineering Technical Conferences and Computers and Information in Engineering Conference (ASME 2014), volume 7, August 2014; R. Minhas, J. de Kleer, I. Matei, B. Saha, B. Janssen, D. G. Bobrow, and T. Kurtoglu. Using fault augmented modelica models for diagnostics. In Proceedings of the 10th International ModelicaConference, pages 437-445, 2014; B. Saha, T. Honda, I. Matei, E. Saund, J. de Kleer, W. C. Janssen, T. Kurtoglu, and D. G Bobrow. Model-based approach for optimal maintenance strategy. In Proceedings of Second European Conference of the Prognostics and Health Management Society, August, 2014.], the physical model can be augmented with fault modes inspired by the physics of failure. The physics-based fault augmentation process adds additional equations to the model. These new equations are dependent on parameters whose activation induces the simulated faulty behavior. The type of faults introduced are domain dependent. It is possible to cover electrical (e.g., short, open connections, parameter drifts), mechanical (e.g., broken flanges, stuck flanges, torque losses due to added friction, efficiency losses), or fluid (e.g., blocked pipes, leaking pipes) domains.

Let $\mathcal{F} = \{F_0, F_1, \ldots, F_L\}$ denote a set of faults for detection and isolation, where $F_0$ denoted the normal behavior. The diagnosis objective is to determine a classifier f: $Y \rightarrow \{F_0, F_1, \ldots, F_L\}$ where Y is a set of observations of the system behavior, typically given by a set of sensor measurement time series that are processed sample by sample (online) or as a batch (offline). A set of fault parameters $\{\theta_1, \ldots, \theta_L\}$ may be associated to each of the fault modes with nominal values $\theta_i^*$ for $i \in \{1, \ldots, L\}$. The classifier fault detection scheme is defined as a variation of observations from their expected values. The fault isolation is based on the deviation of the fault parameters from their nominal values, i.e. $\|\theta_i - \theta_i^*\| \geq \in_i$, where $\in_i$ is a fault specific threshold that can depend on, for example, noise statistics. Several fault parameter deviations are simultaneously possible, hence there may be some ambiguity in the fault diagnosis. This case happens when the sensor measurements do not contain enough information to differentiate between distinct faults. The faults are tracked either online or offline using filters or optimization based parameter estimation techniques.

III. RAIL SWITCH MODEL

Figure 2:
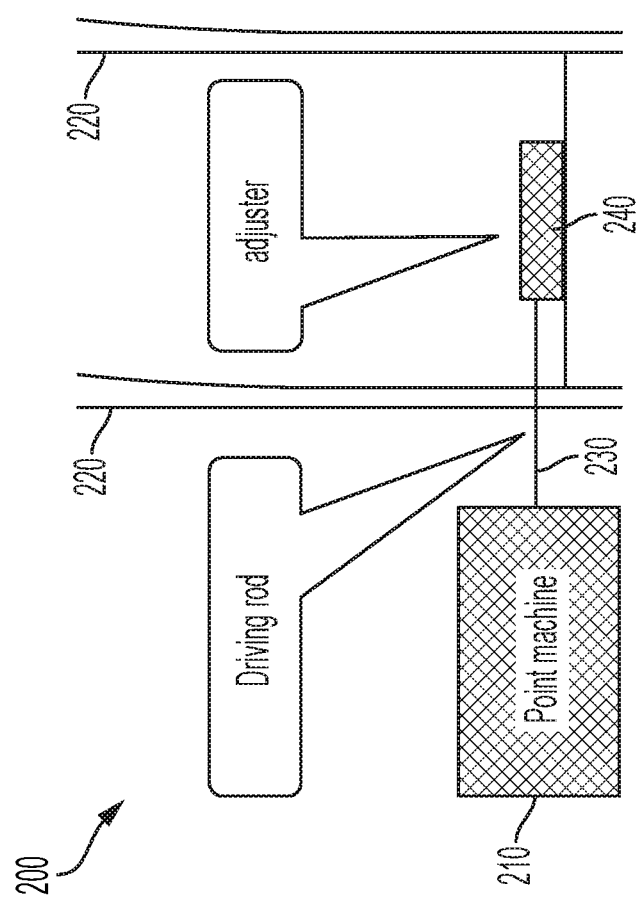
FIG. 2 illustrates a rail switch model example.

As a case study, consider a rail switch system used for guiding trains from one track to another. The rail switch is composed of a servo-motor and a gear-mechanism for scaling the rotational motion and for amplifying the torque generated by the electrical motor. The rail load is composed by a mechanical adjuster, and tongue-rails. The schematics of the system is presented in FIG. 2 depicting the main components of the rail switch 200. The point machine 210 is the component of the rail switch system that is responsible for moving the rails 220 and locking them in the final position until a new motion action is initiated. It is composed of two sub-components: servo-motor and gear mechanism. The electrical motor transforms electrical energy into mechanical energy and generates a rotational motion. The gear mechanism scales down the angular velocity of the motor and amplifies the torque generated by the motor. In addition, using a cam system, the rotational motion is transformed into a translational motion.

Figure 3:
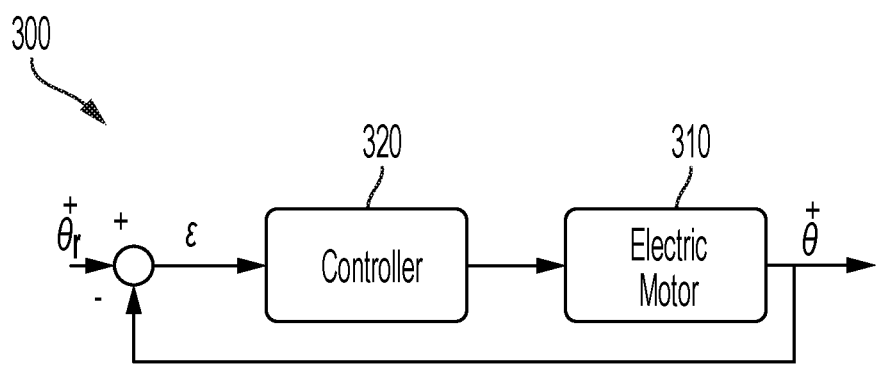
FIG. 3 illustrates an example of servo-motor schematics.
Figure 4:
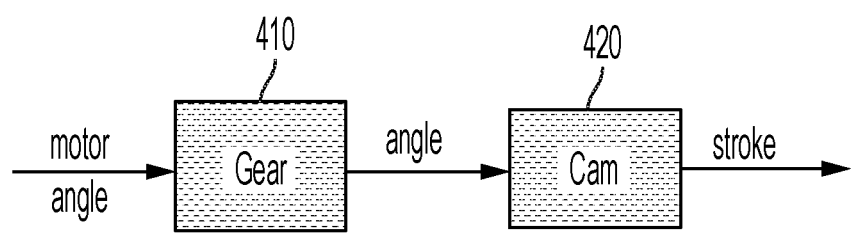
FIG. 4 illustrates an example gear and cam system.

As shown by the example servo-motor schematics 300 of FIG. 3, the servo-motor is composed of two sub-components: an electric motor 310 and a controller 320. The controller 320 ensures that the motor's angular velocity follows a prescribed reference. The angular velocity is perturbed by the rail load torque. As shown by the example of FIG. 4, the gear 410 and cam 420 are responsible for scaling down the angular velocity generated by the servo-motor, amplifying the torque generated by the servo-motor and transforming the rotational motion into a translational motion.

Figure 5:
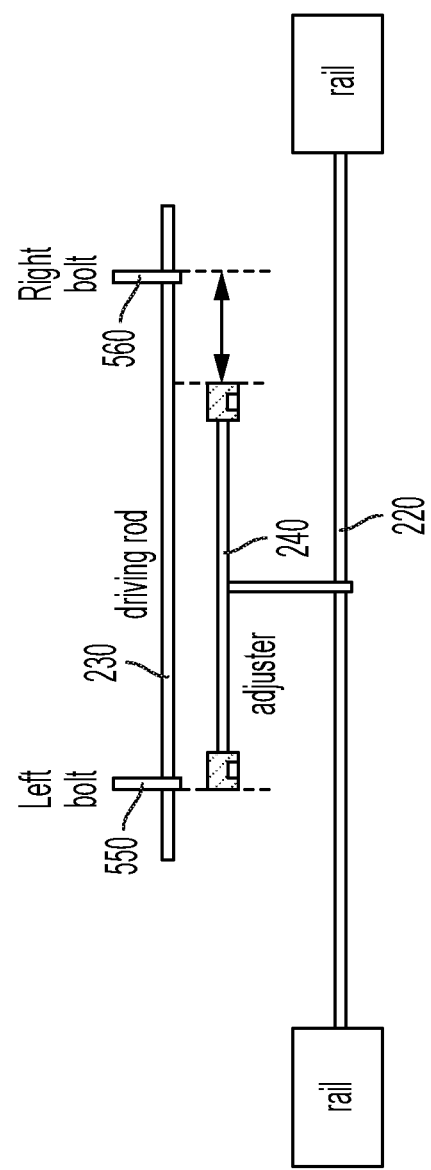
FIG. 5 illustrates an example of adjuster mechanics.

As illustrated in the example of FIG. 5, the rail load is composed of two main components: the adjuster 240 and the tongue rails 220. The adjuster 240 "floats" on the driving rod 230, temporizes the interaction between the driving rod 230 and the rail 220, and transfers the force generated by the motor (through the driving rod 230) to the rails, generating the desired motion. The adjuster 240 connects the driving rod 230 connected to the point machine to the rails 220, and hence it is responsible for transferring the translational motion. There is a delay between when the driving rod 230 and the adjuster 240 start moving. This delay is controlled by two bolts 550, 560 on the driving rod 230. Tighter bolt settings means a smaller delay, while looser bolt settings produce a larger delay. The adjuster 240 is connected to two rails 220 that are moved from left to right or right to left, depending on the traffic needs. The motion of the rail 220 is eased by a set of bearings and affected by the length of the rail 220 and elasticity of the rail 220.

The rail 220 may be viewed as a flexible body, and an approximation method can be used to model beams, namely the lumped-parameter approximation. This method assumes that beam deflection is small and in the linear regime. The lumped parameter approach approximates a flexible body as a set of rigid bodies coupled with springs and dampers. It can be implemented by a chain of alternating bodies and joints. The springs and dampers act on the bodies or the joints. The spring stiffness and damping coefficients are functions of the material properties and the geometry of the flexible elements.

Figure 6:
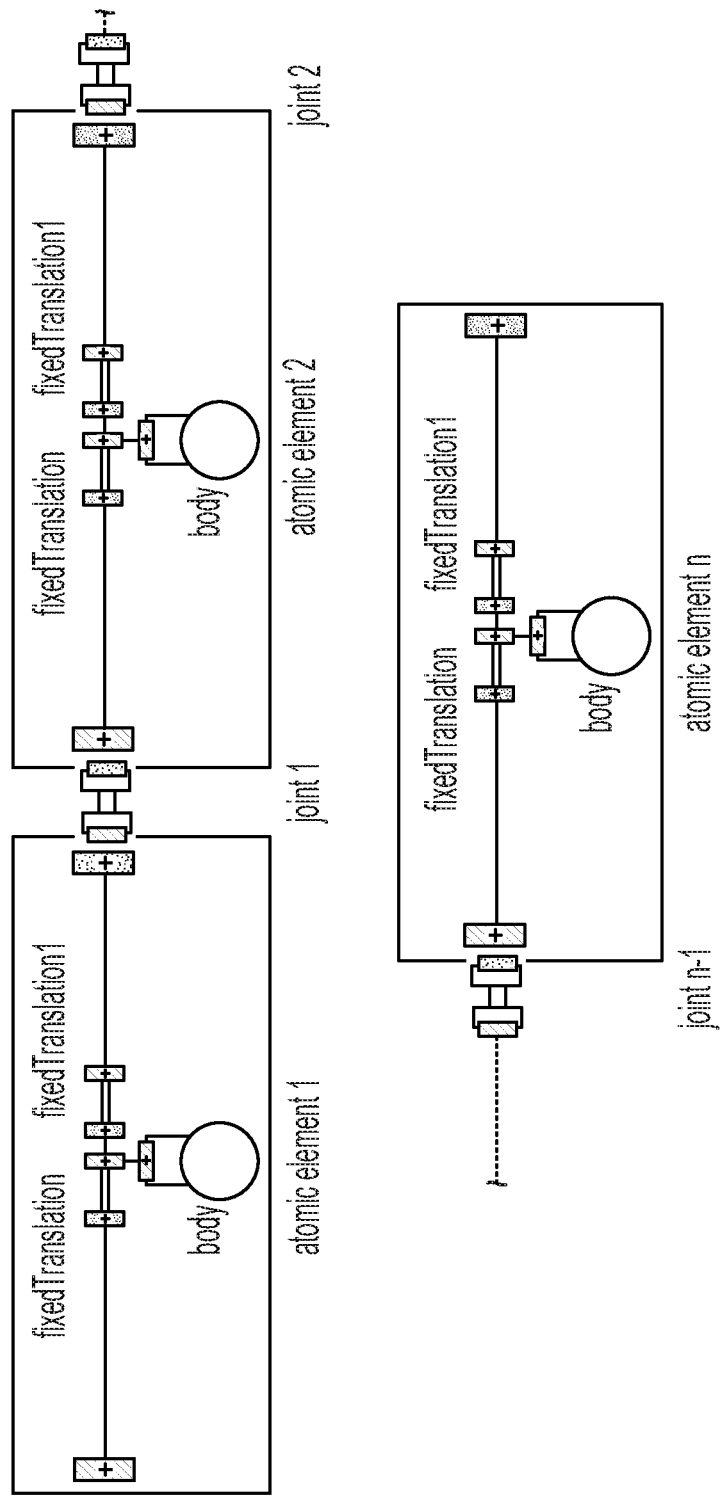
FIG. 6 shows the model of a beam used to model the rail.

In one example, each component of the rail-switch system was implemented in the MODELICA language. FIG. 6 shows the model of a beam used to model the rail. The complexity of the rail switch and the rail models is shown in Table I. The majority of the model complexity is concentrated on the rail model. Hence, producing a reduced representation of this model improves its usability, especially in real time applications. The input for the rail switch signal is a reference signal for the servo-motor controller for each of the two direction of motions. The time horizon for each input reference signal is 7 seconds. Using the high-fidelity model, it takes more than 7 seconds to simulate the model over 14 seconds that include the rail motion in both directions. One objective is to replace the rail component with a simpler representation, to significantly reduce the simulation time.

TABLE I

Rail switch and model statistics

|  | No. of components | Vars | Parameters | Diff. Vars | Equations |
|---|---|---|---|---|---|
| Rail Switch | 595 | 8308 | 1574 | 336 | 5522 |
| Rail Only | 493 | 7244 | 1514 | 288 | 4768 |

IV. FAULT AUGMENTATION

This section describes the modeling artifacts that were used to include in the behavior of the system four fault operating modes: misaligned adjuster bolts (left and right), obstacle, and missing bearings. These fault modes were reported to be of interest by a rail system operator that was collaborated with. Of course, there are many other fault modes of interest at the level of the, for example, the point machine. Such faults are more readily detected due to the rich instrumentation present at the servo-motor.

Figure 7:
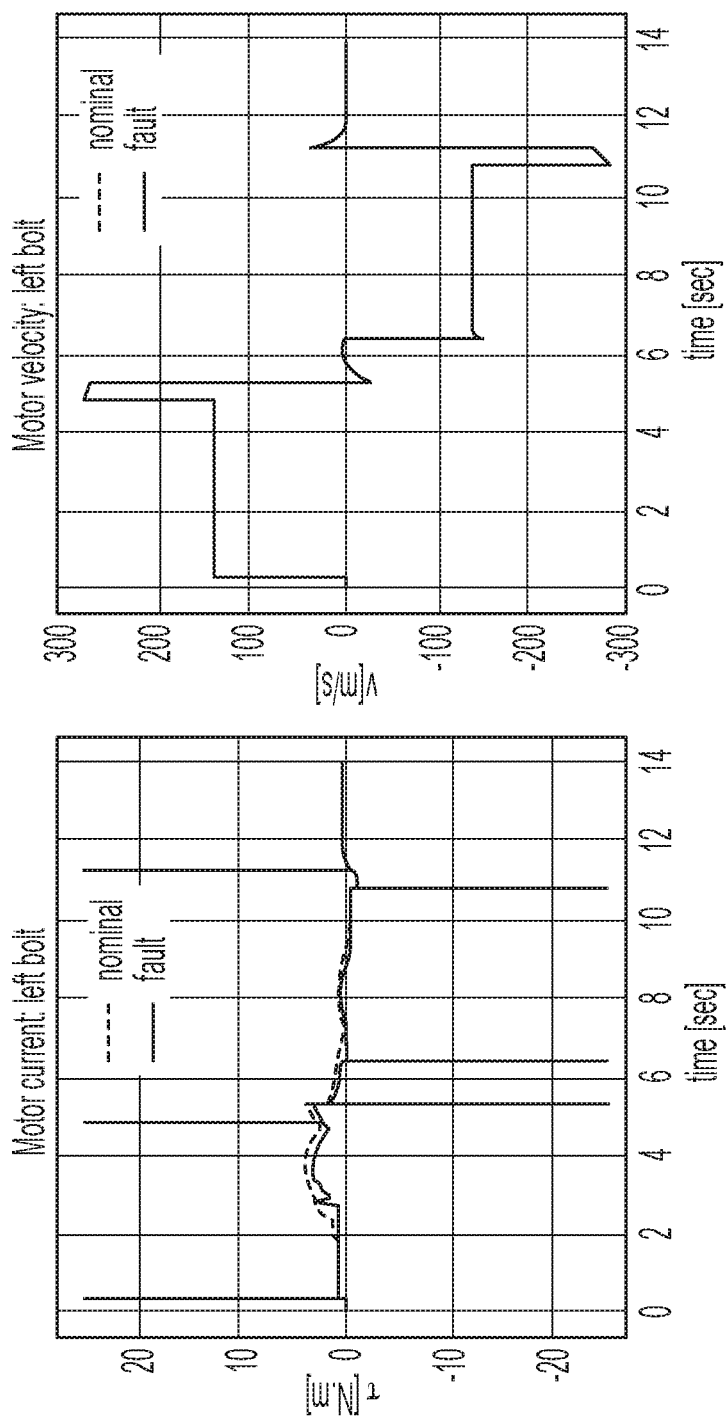
FIG. 7 shows a comparison between the nominal behavior and the misaligned left bolt on the motor current and angular velocity.
Figure 8:
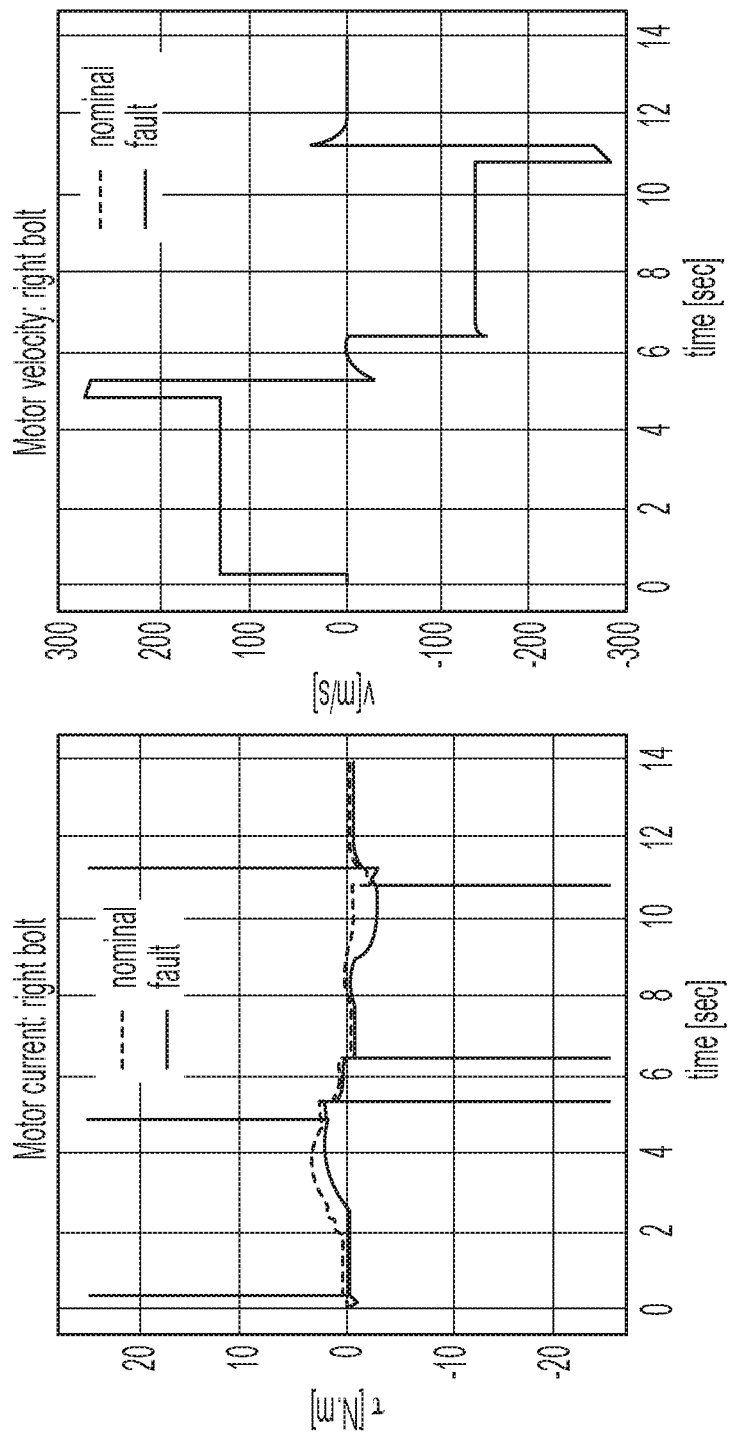
FIG. 8 shows a comparison between the nominal behavior and the misaligned right bolt on the motor current and angular velocity.

Misaligned adjuster bolts fault mode: In this fault mode, the bolts of the adjuster 240 deviate from their nominal position. As a result, the instant at which the drive rod 230 meets the adjuster 240 (and therefore the instant at which the switch rail starts moving) happens either earlier or later. For example, in a left-to-right motion, if the left bolt moves to the right, the contact happens earlier. The reason is that since the distance between the two bolts decreases, the left bolt 550 reaches the adjuster 240 faster. As a result, when the drive rod 230 reaches its final position, there may be a gap between the right switch blade and the right stock rail. In contrast, if the left bolt 550 moves to the left, the contact happens later. The model of the adjuster 240 includes parameters that can set the positions of the bolts 550, 560, and therefore the effects of this fault mode can be modeled without difficulty. FIGS. 7 and 8 show a comparison between the nominal behavior and the misaligned left and right bolts, respectively, on the motor current and angular velocity.

Figure 9:
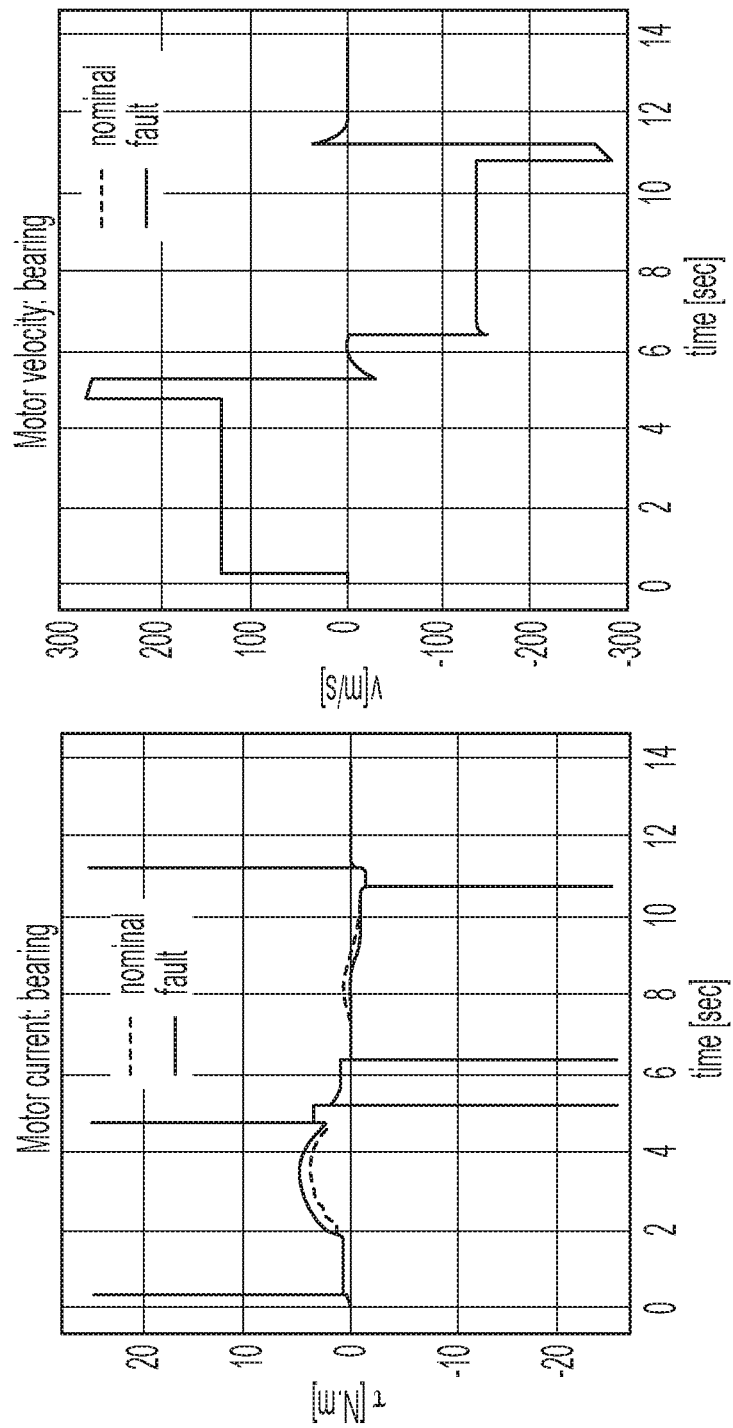
FIG. 9 shows a comparison between the nominal behavior and the missing bearing behavior on the motor current and angular velocity.

Missing bearings fault mode: To minimize friction, the rails 220 are supported by a set of rolling bearings. When the rails 220 become stuck or lost, the energy losses due to friction increase. A component connected to the rail 220 was included to account for friction. This component has a parameter that sets the value for the friction coefficient. By increasing the value of this parameter, the effect of the missing bearings fault can be simulated. FIG. 9 shows a comparison between the nominal behavior and the missing bearing behavior on the motor current and angular velocity.

Figure 10:
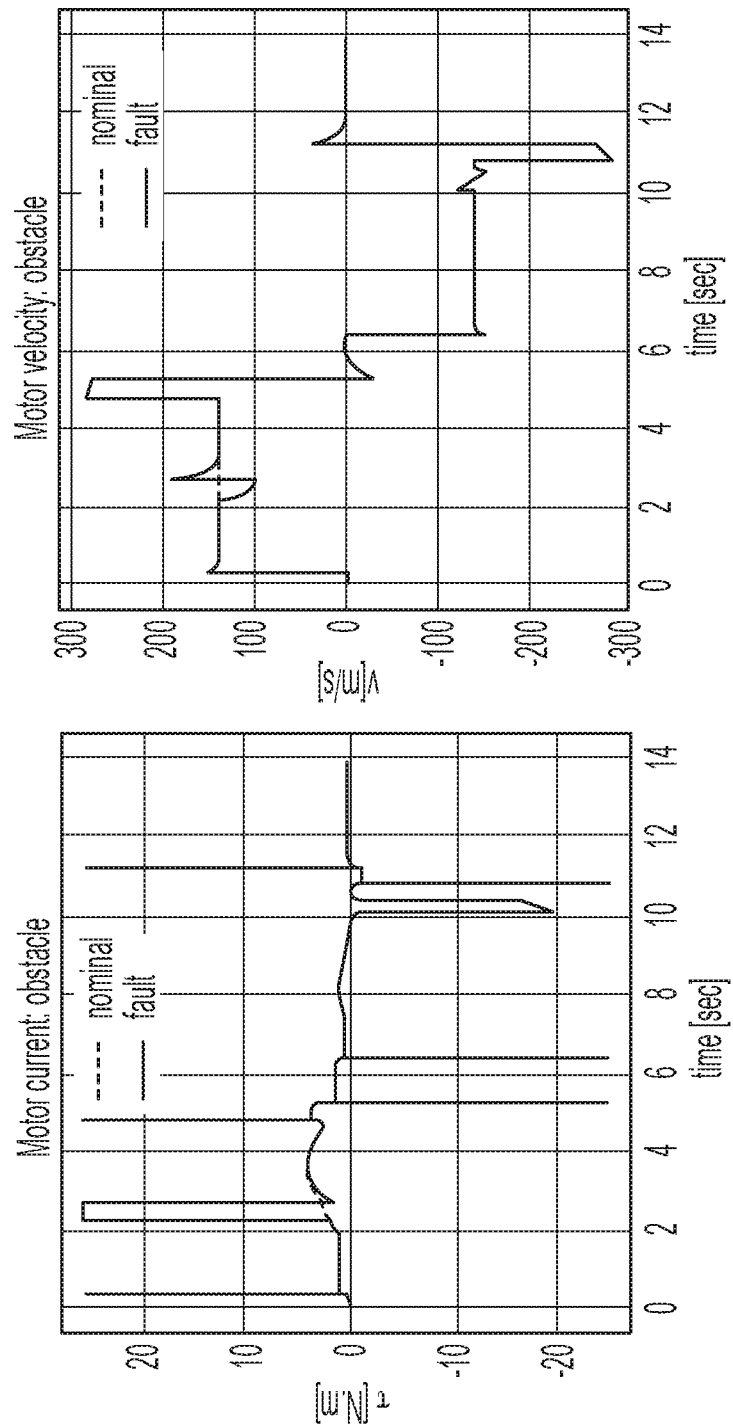
FIG. 10 shows a comparison between the nominal behavior and the obstacle present behavior on the motor current and angular velocity.

Obstacle fault mode: In this fault mode, an obstacle obstructs the motion of the switch blades. In case the obstacle is insurmountable, a gap between the switch blades and the stock rail appears. The effect on the motor torque is a sudden increase in value, as the motor tries to overcome the obstacle. To model this fault, the simulation included a component that induces a localized, additional friction phenomenon for the switch blades. This component has two parameters: the severity of the fault and the position. For very high severity the switch blades cannot move beyond a certain position. FIG. 10 shows a comparison between the nominal behavior and the obstacle present behavior on the motor current and angular velocity.

V. ACAUSAL MODELING

Acausal models are physics based models typically constructed from first principles. Unlike the causal models used in signal processing and control, components of acausal models do not have inputs and outputs but ports (connectors) through which energy is exchanged with other components or the environment. This is the modeling formalism used in the MODELICA [Peter Fritzson. Principles of Object-Oriented Modeling and Simulation with Modelica 3.3: A Cyber-Physical Approach. IEEE Press. Wiley, Hoboken, N.J., 2 edition, 2015.] language or in Simscape. Ports are characterized by variables whose type determines how they are manipulated when two ports are connected. For example, at a connection point, all flow variables sum up to zero (flow conservation), while all non-flow variables are equal. Examples of flow variables include current, force, torque while examples of non-flow variables include potential, velocity, angular velocity. Typically, the product between a flow and a non-flow variable has the physical interpretation of power. The acausal modeling formalism is an instance of the more general port-Hamiltonian formalism [A. J. van der Schaft and D. Jeltsema. Port-hamiltonian systems theory: An introductory overview. Foundations and Trends in Systems and Control, 1(2-3):173-378, 2014.]. The behavior of acausal components is determined by a set of constitutive equations of the form f(x; w)=0, rather than by a causal map (with or without memory). The vector of variables x can include port variables (flow, non-flow) and internal variables (states, algebraic variables), while w is a vector of component parameters, e.g., damping or stiffness coefficients.

Acausal models may be used to give simplified representations of the rail component initially constructed using a finite element approach which typically induces a higher level of complexity. To learn the parameters of the constitutive equations, there are two main scenarios that can be considered. In the first scenario, it is assumed that it is possible to directly measure the component variables. This has the advantage that it is possible to in theory perform the model learning in isolation without considering the entire model. For this approach to work, model representation must be carefully chosen to avoid learning trivial models. The second scenario assumes there is only indirect information about the behavior of the model through measurements that do not include the rail component variables. In this case, the learning must include the entire rail-switch model and it is more computationally intense. Since there is access to the high-fidelity model, and hence it is possible to directly measure every model variable, the first scenario is considered. Some embodiments use two types of representations for the (acausal) rail component: causal and acausal. In this regard, it should be noted that some embodiments force a causal behavior for the acausal component.

In the causal case, some embodiments assume that some variables are inputs while other variables are outputs. This assumption is not adhoc. It comes from a causal analysis of the entire system model that produces causal relationships between the system variables. This causal analysis is typically performed before simulating a dynamical system represented as a differential algebraic equation (DAE) [Francesco Casella. Introduction to the Dynamic Modelling of Thermo-Fluid Systems using Modelica—mini course, March 2011.]. Once the input/output variable assignment is done, some embodiments select a representation for the constitutive equations (e.g., a neural network) and move to the parameter learning step. Note that instead of assigning the component variables to an input/output category, it is possible to try to learn the component parameters by assuming that all variables are inputs and the output is zero for all inputs. This approach can only work when considering the entire system model, a case which introduces a regularization effect that prevents learning a trivial equation such as the constant zero map. Indeed, a zero map playing the role of a constitutive equation can make the system model unsimulatable due to a singular Jacobian of the system DAE.

In the acausal case, the constitutive equations emulate physical laws. The following discusses different options for the constitutive equations that guarantee that the overall system model can be simulated. Since the behavior of the component can be fairly complex, a large set of constitutive equations may be needed. To avoid arbitrary choices of constitutive equation maps, some embodiments use networks of generalized mass spring dampers (gMSD). In such a network, each node is a composition of one generalized mass, spring and damper in a parallel connection, and each link is a composition of one spring and damper. To ensure that the component modeled as a network of gMSDs does not destabilize the overall system model, conditions are imposed on the gMSDs that ensure that the model can be simulated. Such a condition is dissipativity. A dissipative component cannot generate energy internally. A formal definition of a dissipative component is given in what follows.

Definition 5.1: Let $E(t)=E(t_0)-\int_{t_0}^t p(\tau)d\tau$ be the energy of a physical component, where p(t) is its power. The component is dissipative if $E(t) \leq E(t_0)$ for all $t \geq t_0$. Some embodiments use two types of maps for the gMSD. The first type is based on a polynomial representation as described in the following proposition.

Proposition 5.1: Consider a component represented as a network of gMSD where the behavior of the masses, springs and dampers are given by:

$$F_m = \Sigma_{i=0}^n m_i \text{sign}(\ddot{x})\ddot{x}^i,$$

$$F_c = \Sigma_{i=0}^n c_i \text{sign}(\dot{x})x^i,$$

$$F_d = \Sigma_{i=0}^n d_i \text{sign}(\dot{x})\dot{x}^i,$$

respectively, where the scalars $m_i$, $d_i$ and $c_i$ are non-negative, and n is the polynomial order. Then the component is dissipative.

An alternative definition for the gMSD is given in the following proposition.

Proposition 5.2: Consider a component represented as a network of gMSD where the behavior of the masses, springs and dampers are given by:

$$F_m = m(x,\dot{x},\ddot{x})\ddot{x},$$

$$F_c = k(x)x,$$

$$F_d = d(x,\dot{x})\dot{x},$$

respectively, where $m(\bullet,\bullet,\bullet)$, $k(\bullet)$ and $d(\bullet,\bullet)$ are non-negative scalar functions. Then the component is dissipative.

Note that there is a lot of freedom with respect of modeling the functions $m(\bullet,\bullet,\bullet)$, $k(\bullet)$ and $d(\bullet,\bullet)$. These can be modeled, for example, as neural networks, where it is ensured that the last layer imposes a non-negative output through a "ReLu" layer or by taking the square of the output of the last linear layer. Since the constitutive equations may contain differential equations, it is necessary to use learning platforms with ODE solving capabilities (e.g., Pytorch [Adam Paszke, Sam Gross, Soumith Chintala, Gregory Chanan, Edward Yang, Zachary DeVito, Zeming Lin, Alban Desmaison, Luca Antiga, and Adam Lerer. Automatic differentiation in pytorch. 2017.], TensorFlow [Martin Abadi et al. TensorFlow: Large-scale machine learning on heterogeneous systems, 2015. Software available from tensorflow.org.], DAETools [Dragan D. Nikolié. Dae tools: equation-based object-oriented mod¬elling, simulation and optimisation software. PeerJ Computer Science, 2:e54, April 2016.]), if the state derivatives are not measured.

It should be noted that the equations in propositions 5.1 and 5.2 apply to all mechanical systems. In this regard, it should be understood that equivalents for the electrical and thermal-fluid domain exist as well.

VI. HYBRID RAIL SWITCH MODEL

In this section several approaches are introduced for simplifying the rail switch component model. In addition to model simplification, this section also focuses on preserving the physical interpretation of the reduced model through appropriate choices of constitutive equation maps. It is assumed that there are access to the variables at the connection point between the adjuster 240 and the rails. In particular, it is assumed that it is possible to directly measure the force F, position x, velocity v and acceleration a. Two modeling approaches are used:

Causal approach: Some embodiments determine a causal relation between the force, position, velocity an acceleration and use a causal map such as a neural network to model the relation between them. The resulting component model is still acausal, though, with an imposed variable dependence.

Acausal approach: The rail component is modeled as a combination of generalized mass, spring, dampers as defined in Propositions 5.1 and 5.2. It will be shown that one mass-spring-damper component is sufficient.

Figure 11:
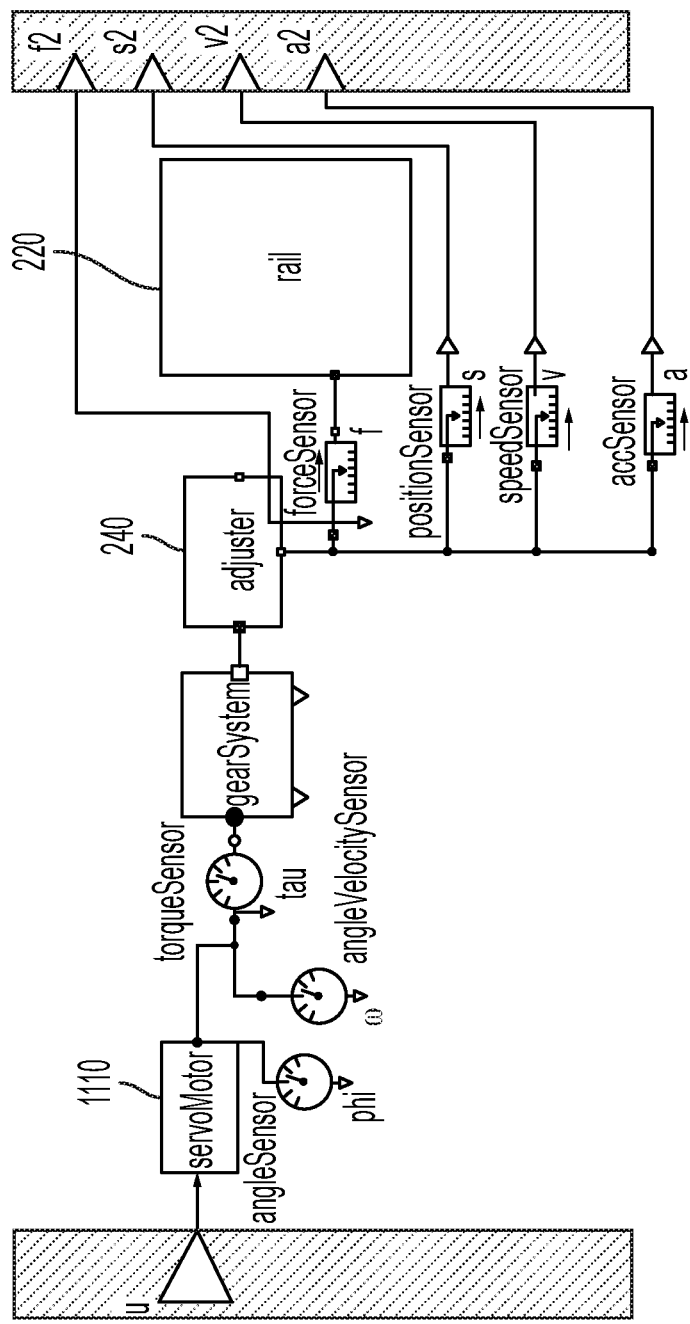
FIG. 11 shows a block diagram of a rail switch model.
Figure 12:
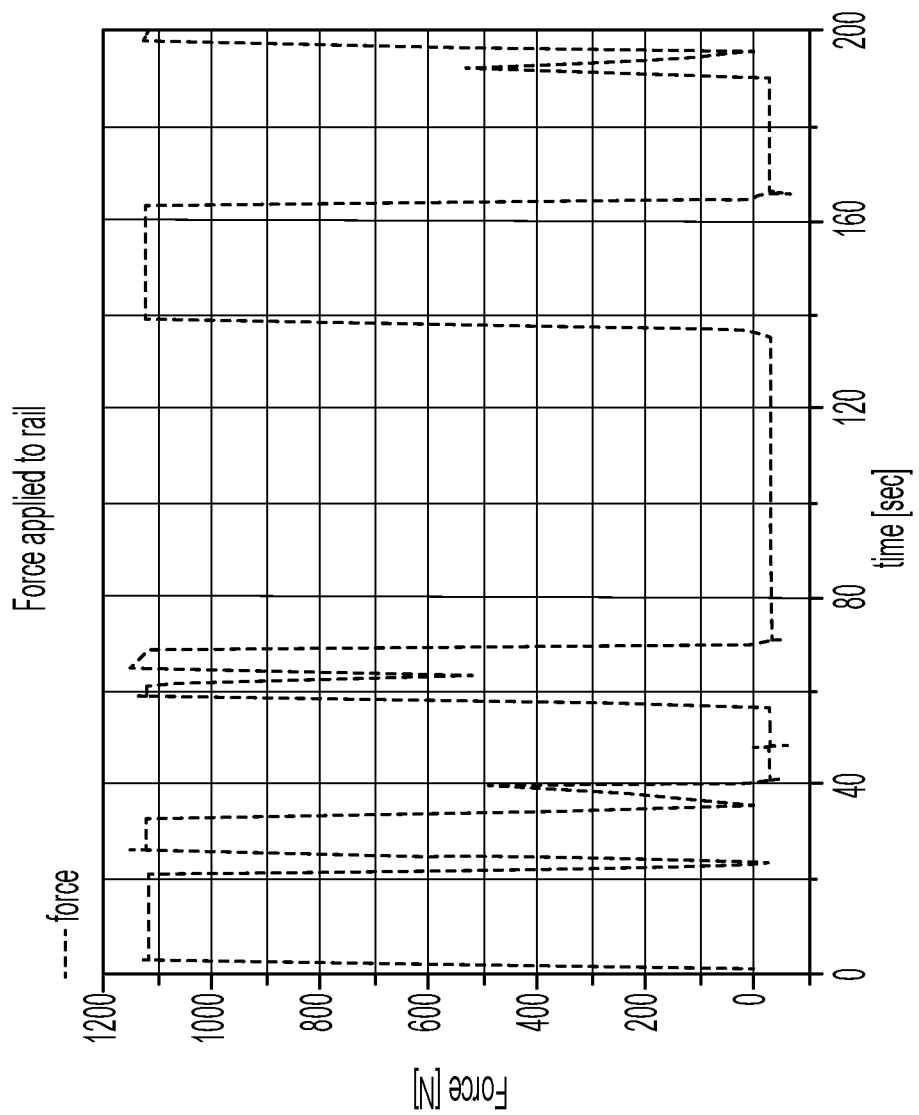
FIG. 12 shows an example of rail force.
Figure 13:
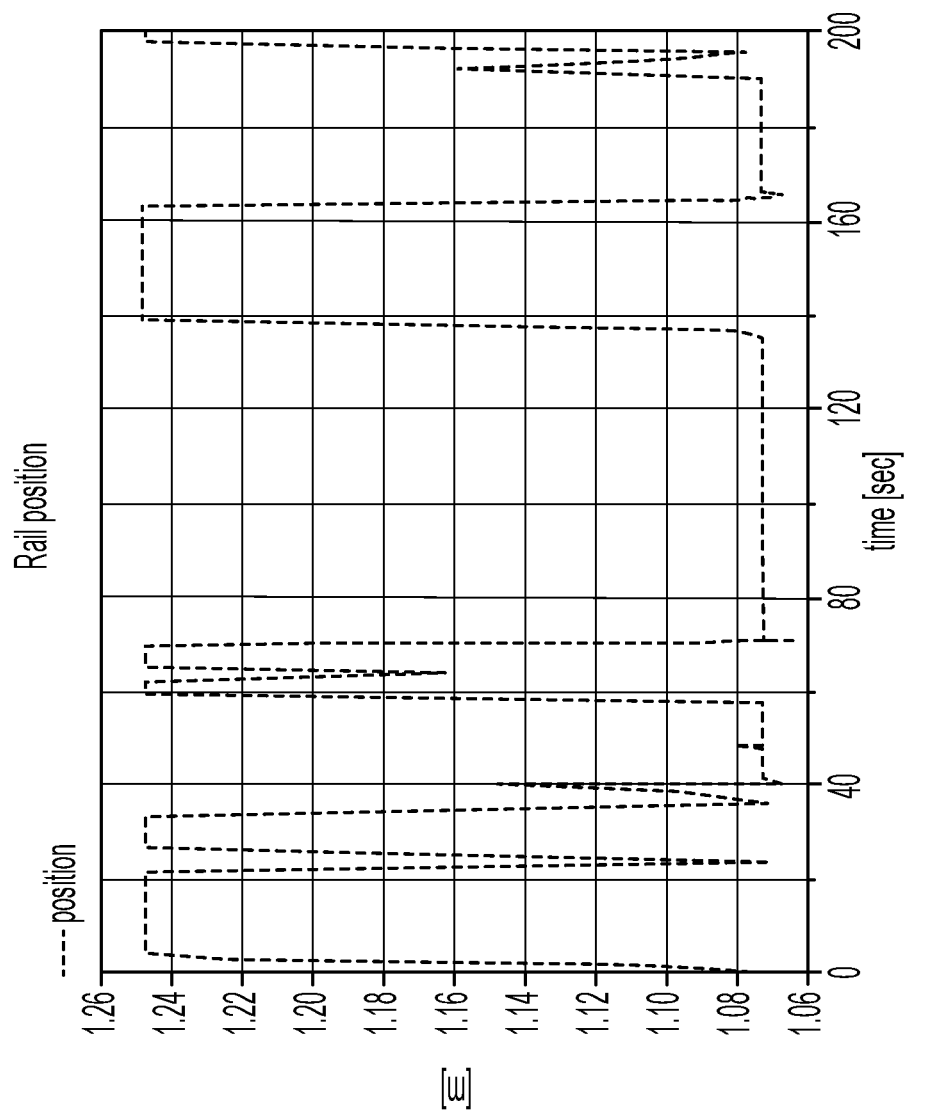
FIG. 13 shows an example of rail position.
Figure 14:
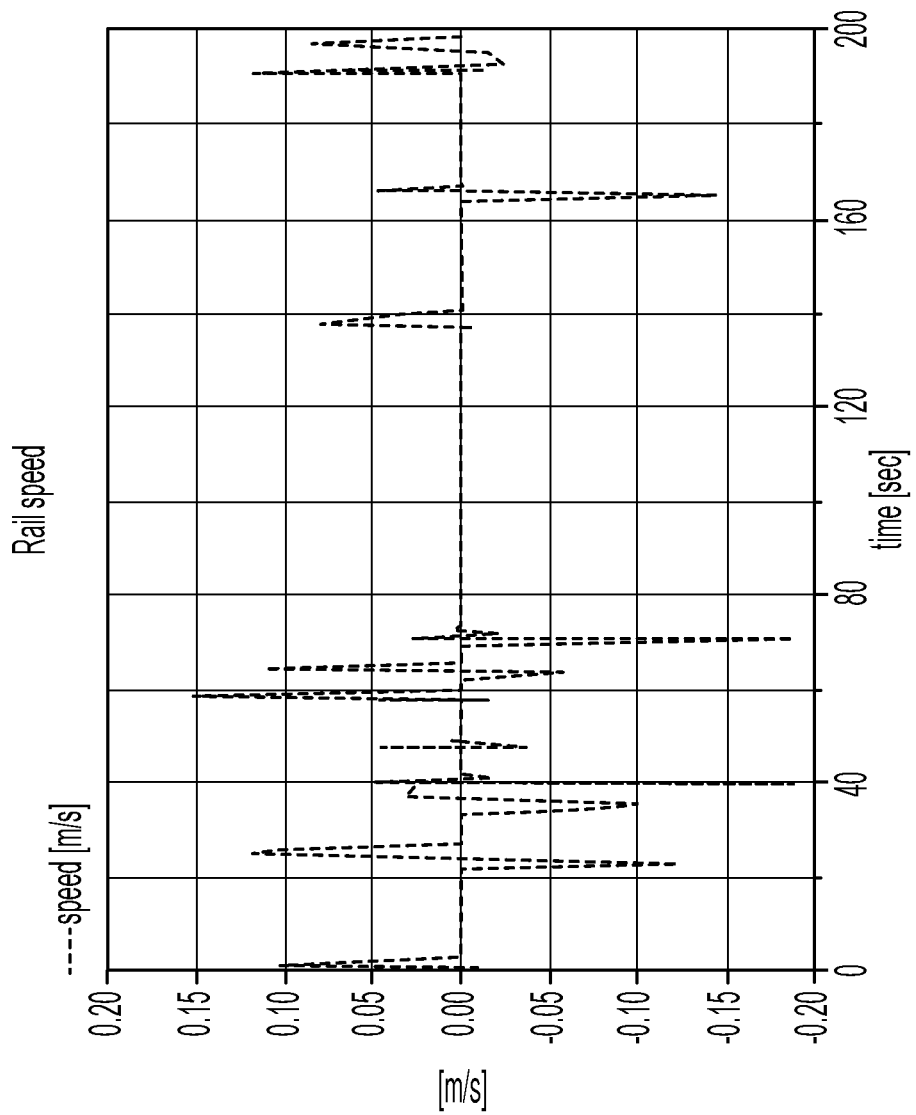
FIG. 14 shows an example of rail speed.

The training data is generated by simulating the high-fidelity rail switch model. The block diagram of the rail switch model is shown in FIG. 11. It has an input current references for the servo-motor 1110, correlated with a desired velocity profile. In some embodiments, pre-determined current trajectories are fed to the servo-motor 1110 to generate the rail motion. Some embodiments use random inputs to push the rail 220. The force, position, velocity and acceleration trajectories are recorded and used as training data. Each time series corresponds to a time interval of 100 seconds, sampled at 0.1 seconds. When appropriate, a one time series may be used for training or several of them. Examples of rail force, position and speed trajectories used for training are shown in FIGS. 12, 13 and 14, respectively.

A. Causal Modeling

Figure 15:
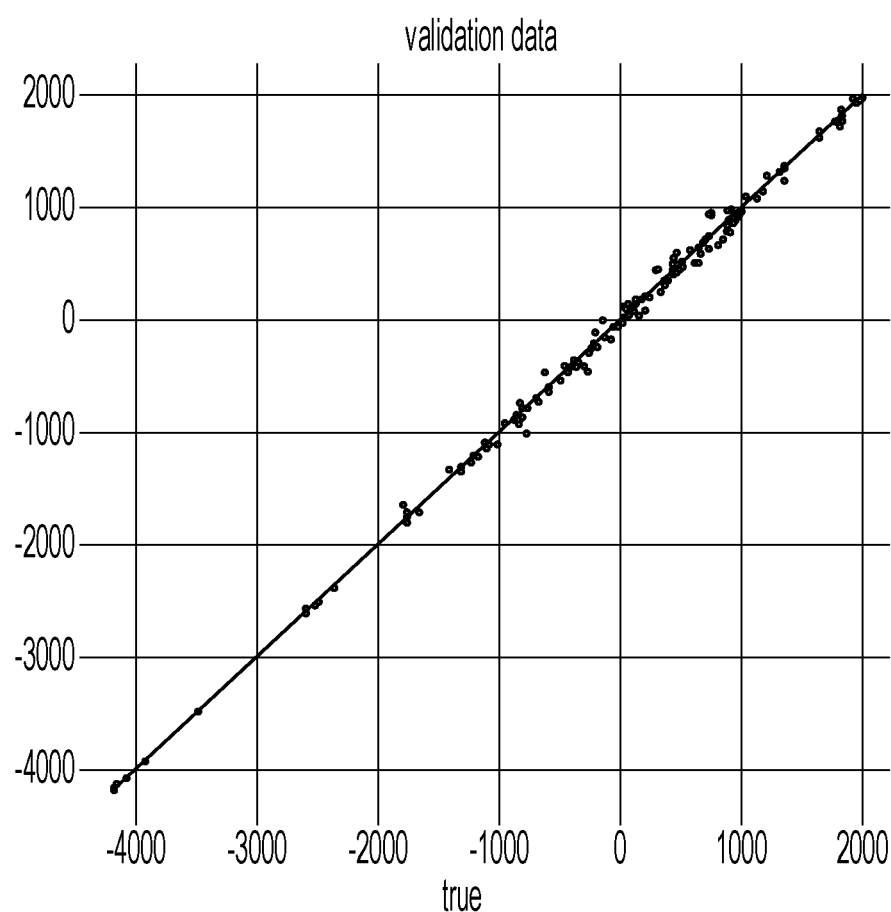
FIG. 15 shows validation of an example learned model, including true vs predicted output samples.

In one causal modeling approach, causality relations are assigned to the variables at the connection point between the adjuster 240 and the rails 220. Since the servo-motor tracks a pre-specified speed pattern, intuition should tell us that the position and velocity of the rails are set by the motor. This intuition is confirmed by a causal analysis performed by looking at the block lower triangular (BLT) transformation [Francesco Casella. Introduction to the Dynamic Modelling of Thermo-Fluid Systems using Modelica—mini course, March 2011.] that depicts the causal relations between the system variables. Hence, some embodiments model the rail behavior by using a causal map $F=g(u; w)$, where $g: \mathbb{R}^3 \to \mathbb{R}$ is a map described by a neural network (NN) with one hidden layer:

$$g(u) = W^{[1]}(\tanh(W^{[0]}u + b^{[0]})) + b^{[1]},$$

where, the input $u=[x,\dot{x},\ddot{x}]$ is a vector containing the position, speed and acceleration, the output F is the force, and $w=\{W^{[0]}, b^{[0]}, W^{[1]}, b^{[1]}\}$ is the set of parameters of the map g. Some embodiments employ a two step training process. In the first step, the parameters of the map are trained in isolation, considering the map g only. In one implementation, a 15 time series containing trajectories of the force, position, speed and acceleration was used. The Keras [Francois Chollet et al. Keras. https://keras.io, 2015.] deep-learning training platform, proceeded by splitting the data into training (70%) and test (30%) data sets were also used. The hidden layer dimension was chosen to be 50, and the NN parameters were trained using a decaying learning rate. The validation results are shown in FIG. 15, which depicts the true vs. predicted output samples using as input the test data set. The mean square error (MSE) for the validation data was $MSE_{test}=415.46$. Although it may appear a large value, it must be interpreted relative to the values of the force used in training and validation, since the training data was not normalized to maintain physical interpretation.

The weights of the Keras model were used to implement a model component with one port and the constitutive equation given by $=W^{[1]}(\tanh(W^{[0]}u+b^{[0]}))+b^{[1]}$, where $u=[x,\dot{x},\ddot{x}]$. Next, a fine tuning of the component parameters was executed by performing a parameter learning step using the entire rail switch model. This way, the rest of the model equations are considered, adding an additional regularization effect. A gradient-free optimization algorithm was chosen, namely the Powell algorithm, to avoid using gradient approximations.

The rail switch model was converted into a functional mockup unit (FMU) [T. Blochwitz, M. Otter, M. Arnold, C. Bausch, C. Claus, H. Elmqvist, A. Junghanns, J. Mauss, M. Monteiro, T. Neidhold, D. Neumerkel, H. Olsson, J. v. Peetz, S. Wolf, Atego Systems Gmbh, Qtronic Berlin, Fraunhofer Scai, and St. Augustin. The functional mockup interface for tool independent exchange of simulation models. In In Proceedings of the 8th International Modelica Conference, 2011.], and integrated with the Powell algorithm in PYTHON. Although gradient free algorithms are typically slow for a large number of variables, it was not needed to run the algorithm for a large number of iterations since the Keras solution was used as initial parameter values. The result of this additional step was a 20% improvement of the loss function applied to the test data. The complexity of the model component is shown in Table II.

TABLE II

| | Complexity of a rail model using a causal map | | | | |
|---|---|---|---|---|---|
| | No. of components | Variables | Parameters | Diff. variables | Equations |
| Causal rail representation | 1 | 15 | 255 | 2 | 8 |

B. Acausal Modeling

Figure 16:
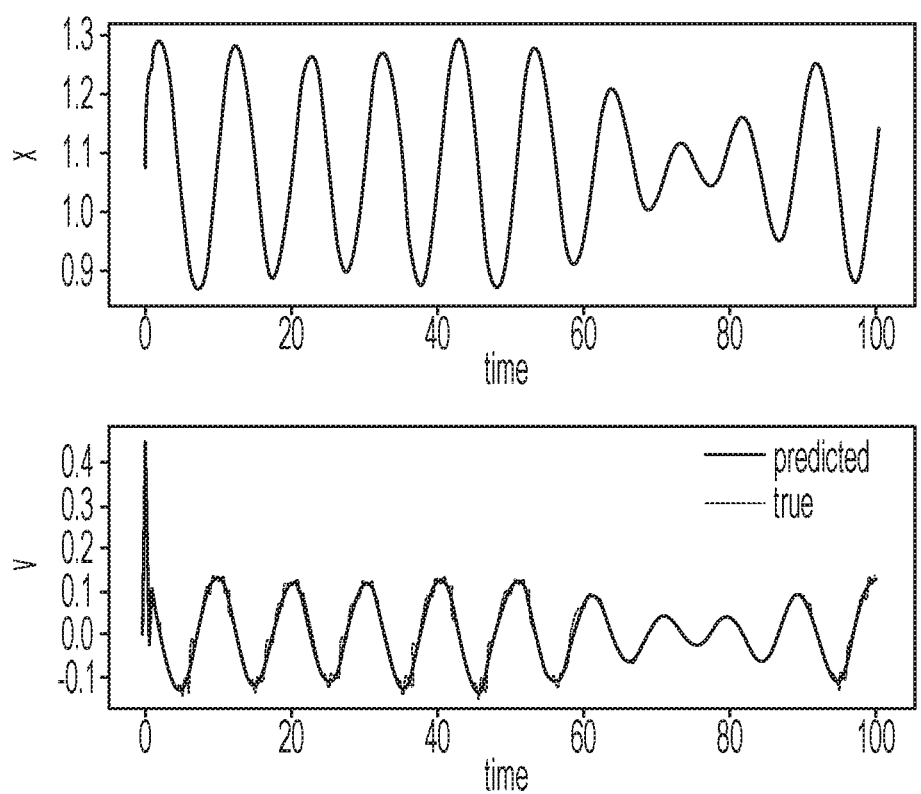
FIG. 16 shows a true vs predicted position and speed time series for an acausal rail model example in polynomial form.

The previous section illustrated how it is possible to use causal maps inside acausal components. The advantage of the causal representation is that it makes it possible to use main stream deep learning platforms to learn the parameters of the causal map. There is a significant disadvantage though: it is not clear if the obtained component is reusable. "Reusability" should be understood as the ability to use the component in different configurations while still behaving as expected. From a numerical perspective view, this means that implementations should be able to compute the acceleration when the force becomes the input (position and speed are state variables and considered known from the previous simulation step). The acausal modeling approach advantageously guarantees this. Using the observation that the rail opposes motion, the rail was modeled as a combination of a generalized mass-spring damper in a parallel connection. This implementation used two types of gMSD models: polynomial and NN. This implementation considered a linear mass model: $F_m=m\ddot{x}$ for both cases. In the polynomial case, the following models were considered for the spring and damper, respectively: $F_c=c_0(x-x_{fix})+c_1(x-x_{fix})^3+c_2(x-x_{fix})^5$ and $F_d=d_0\dot{x}+d_1\dot{x}^3+d_2\dot{x}^5$. The set of parameters to be learned is $w=(m, c_0, c_1, c_2, d_0, d_1, d_2, x_{fix})$. Unlike the previous section, this implementation considers as input the force, and as outputs the position and velocity. The model parameters are the solution of the following constrained optimization problem:

$$\min_w \frac{1}{2N}\sum_{i=1}^{N} \|x(t_i) - \hat{x}(t_i)\|^2 + \|\dot{x}(t_i) - \hat{\dot{x}}(t_i)\|^2$$

subject to:

$m\ddot{x}(t_i)+F_c(t_i)+F_d(t_i)=F(t_i)$, $F_c(t_i)=c_0(x(t_i)-x_{fix})+c_1(x(t_i)-x_{fix})^3+c_2(x-x_{fix})^5$, $F_d(t_i)=d_0\dot{x}(t_i)+d_1\dot{x}(t_i)^3+d_2\dot{x}(t_i)^5$, $w=\{m,c_0,c_1,c_2,d_0,d_1,d_2,x_{fix}\}$.

where $t_i$ are time samples of the time series. The optimization problem used one time series only and used a nonlinear least square algorithm. The DAETools [Dragan D. Nikolié. Dae tools: equation-based object-oriented modelling, simulation and optimisation software. PeerJ Computer Science, 2:e54, April 2016.] PYTHON package was used to implement the optimization algorithm because it provides access to the gradients of the cost function, hence gradient approximations are not needed. The resulting optimal parameters are as follows: $c_0^*=6.5\times10^3$, $c_1^*=0.45$, $c_2^*=4.15\times10^4$, $d_0^*=5.96\times10^2$, $d_1^*=0$, $d_2^*=0$, $m^*=1.5\times10^2$, $s_0^*=1.077$. The true vs predicted time series are shown in FIG. 16. The learning results shows that the polynomial representation for the acausal rail model captures the dominant behavior of both the position and speed. The learning process was repeated when the acausal rail model was represented using neural network representations. In particular, models for the spring and damper $F_c=c(x,\dot{x})^2(x-x_{fix})$ and $F_d=d(x,\dot{x})^2\dot{x}$, respectively, were chosen, where $c(x,\dot{x})$ and $d(x,\dot{x})$ are modeled as neural networks with one hidden layer of size 15 and tanh as activation function. Using the DAETool, the following optimization problem was solved:

$$\min_w \frac{1}{2N}\sum_{i=1}^{N} \|x(t_i) - \hat{x}(t_i)\|^2 + \|\dot{x}(t_i) - \hat{\dot{x}}(t_i)\|^2$$

subject to $m\ddot{x}(t_i)+F_c(t_i)+F_d(t_i)=F(t_i)$, $F_c(t_i)=c(x(t_i),\dot{x}(t_i))^2(x(t_i)-x_{fix})$, $F_d(t_i)=d(x(t_i),\dot{x}(t_i))^2\dot{x}(t_i)$, $c(x(t_i),\dot{x}(t_i))=W_c^{[1]}\tanh((W_c^{[0]}[x(t_i),\dot{x}(t_i)]^T+b_c^{[0]}))+b_c^{[1]}$, $d(x(t_i),\dot{x}(t_i))=W_d^{[1]}\tanh((W_d^{[0]}[x(t_i),\dot{x}(t_i)]^T+b_d^{[0]}))+b_d^{[1]}$, $w=\{m,W_c^{[1]},b_c^{[1]},W_c^{[0]},b_c^{[0]},W_d^{[1]},b_d^{[1]},W_d^{[0]},b_d^{[0]},x_{fix}\}$, It should be understood that the example constrained optimization problems above are applicable to the described exemplary rail switch model. In this regard, it should be further understood that constrained optimization problems for electrical systems would include variables of current, voltage, resistance, and so forth rather than force, mass, and acceleration. For rotational mechanical systems, the variables would include torque, inertia, angular velocity and angular acceleration. For fluid systems, the variables would include mass flow rates, pressure, temperature, enthalpy rate.

Figure 17:
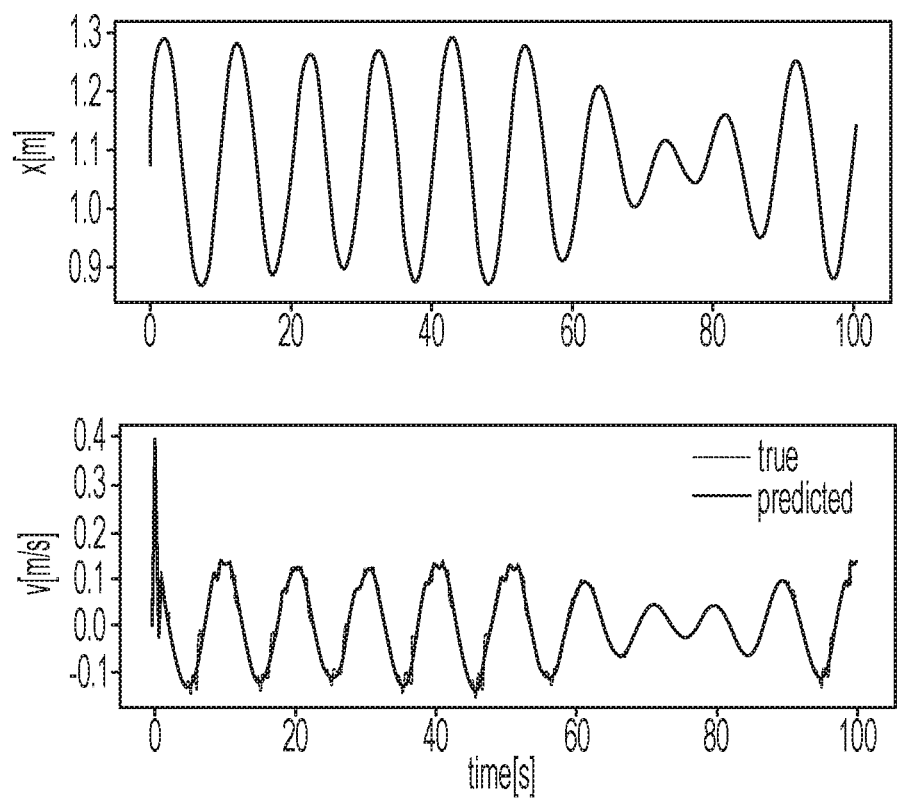
FIG. 17 shows an example of true vs predicted position and speed time series for the acausal rail model in NN form.

Returning to the example of a rail switch model, as seen in FIG. 17, with the neural network representation it is possible to recover a more detailed behavior for the speed. The complexity of the acausal rail models in the two representations are shown in Table III.

TABLE III

Complexity of the rail model using acausal representations

| | No. of components | Variables | Parameters | Diff. variables | Equations |
|---|---|---|---|---|---|
| Acausal poly | 1 | 17 | 9 | 2 | 7 |
| Acausal NN | 1 | 25 | 128 | 2 | 11 |

Figure 18:
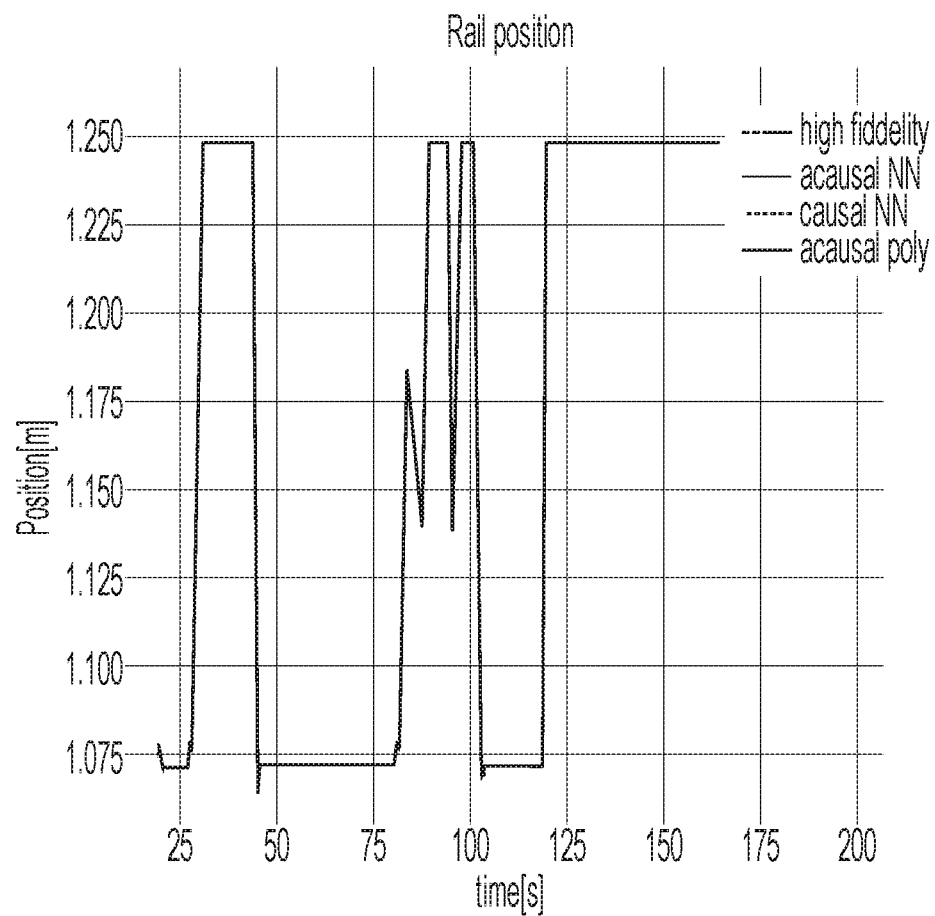
FIG. 18 shows an example of rail position for high and low fidelity models.
Figure 19:
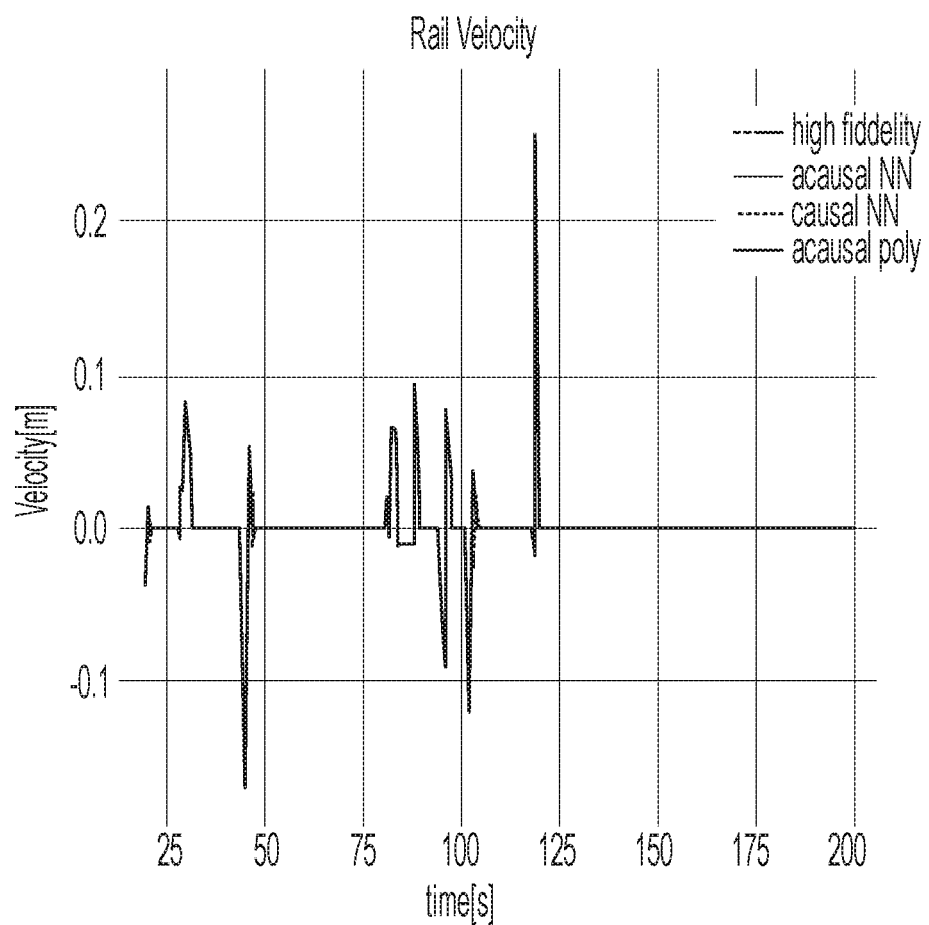
FIG. 19 shows an example of rail velocity for high and low fidelity models.
Figure 20:
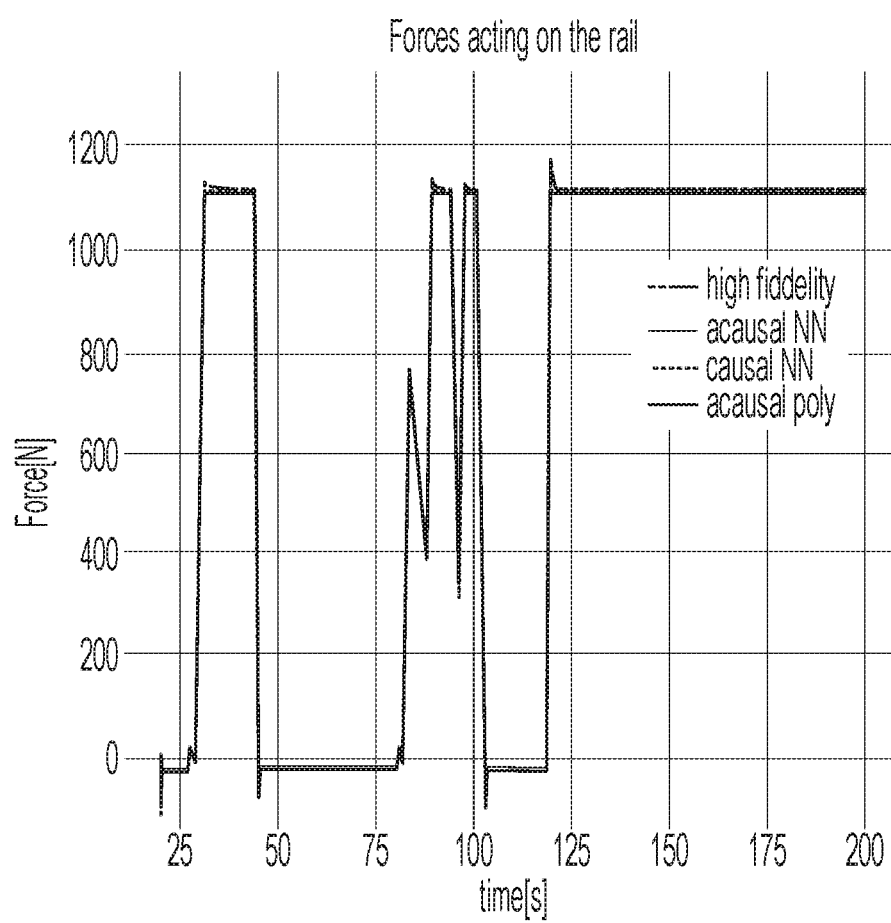
FIG. 20 shows an example of rail force for high and low fidelity models.

The learned models were validated by integrating them within the overall rail switch model. A 25 time series was generated with random inputs for the servo-motor used for the four rail switch models: the high fidelity one, and three low fidelity corresponding to the causal NN, acausal polynomial and acausal NN representations, respectively. An example of such time series is shown in FIGS. 18, 19 and 20.

Figure 21:
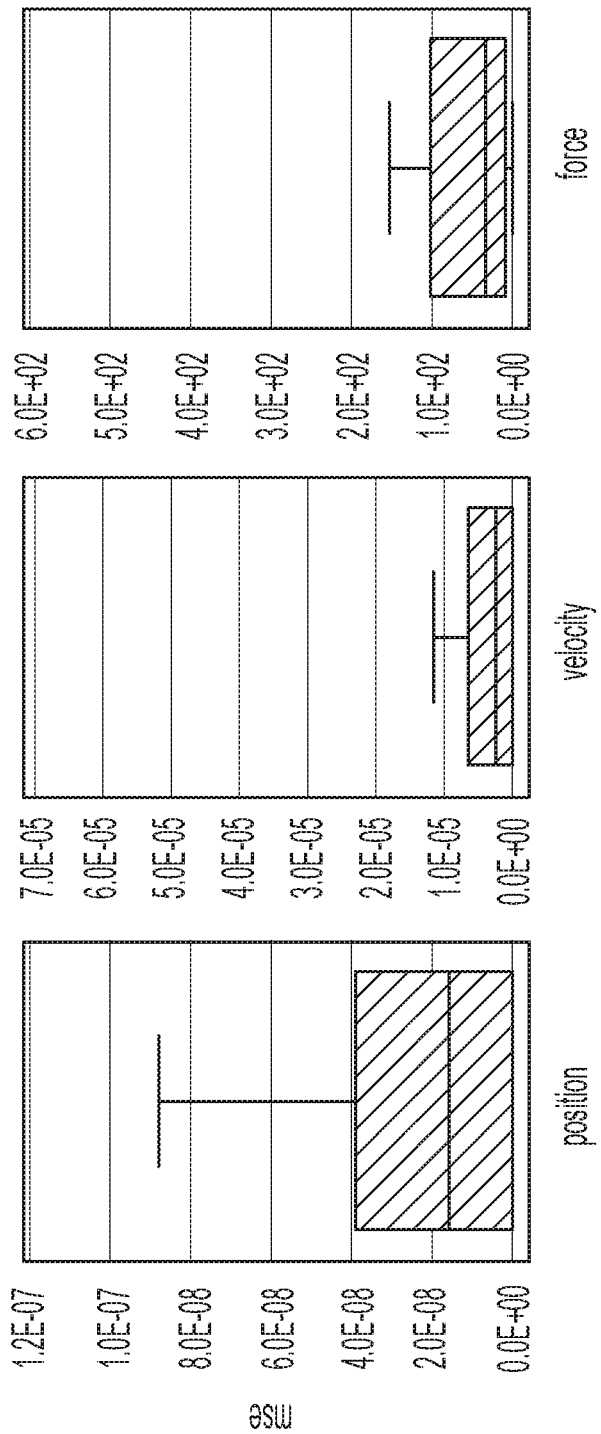
FIG. 21 shows an example of validation of statistical results for causal rail representation.
Figure 22:
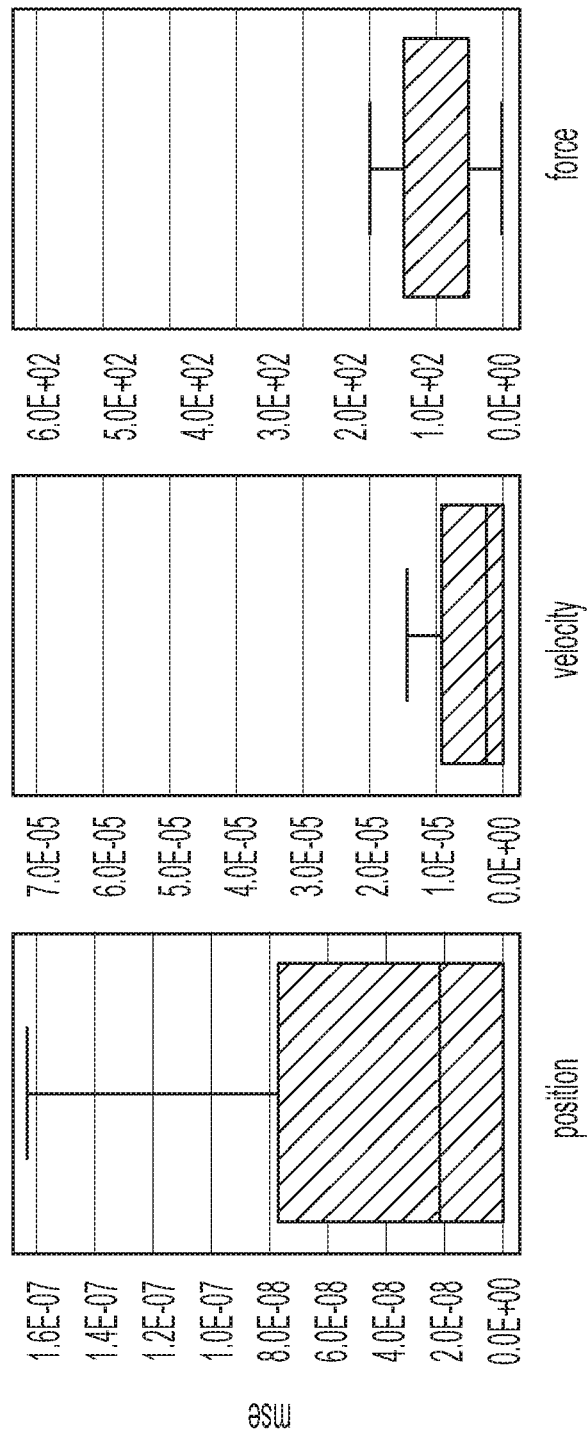
FIG. 22 shows an example of validation of statistical results for an acausal rail representation.
Figure 23:
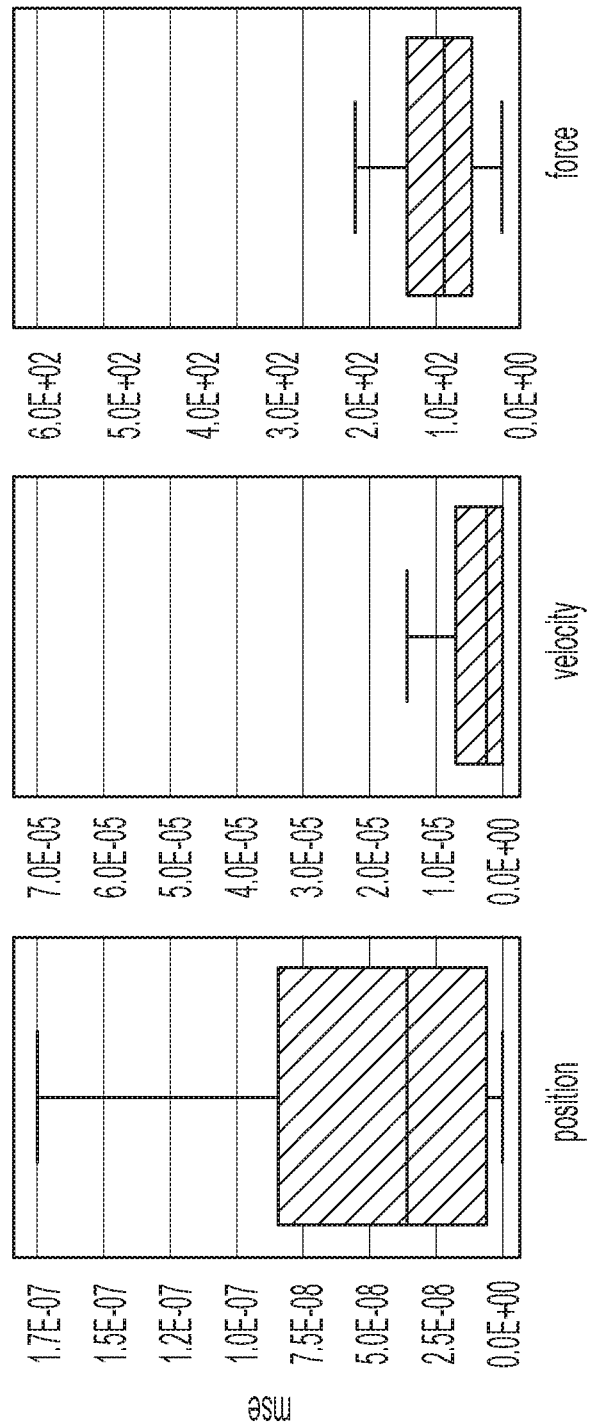
FIG. 23 shows an example of validation of statistical results for an acausal NN rail representation.

The 25 time series was used to compute MSE statistics for the position, velocity and force. The results are shown in FIGS. 21, 22 and 23 as box plots. A first observation is that the MSEs corresponding to the force have large values as compared to the position and velocity. This should not be a surprise since the absolute values of the force are in the thousands. The position and velocity MSEs are similar for all three cases. In the case of the force, the acausal representations have roughly the same statistics; while in the causal case, the MSE has both the variances and mean comparable, but slightly smaller. This again should not be a surprise since the rail causal model is tailored for this scenario. In other works, the model may be overfitted. In a different usage scenario, the casual representation may not even simulate. Hence, there is a trade-off between accuracy and generalizability.

VII. FAULT DIAGNOSIS

Some embodiments use the high-fidelity model as the ground truth, and use the fault component and parameters to generate faulty behavior. For the adjuster bolt misalignment, some embodiments consider one at a time, 50 mm and 200 mm to the left and to the right bolt misalignment. Two parameters have been introduced in the adjuster model that allow for bolt misalignment modeling, whose nominal values are zero. In the case of the missing bearing fault, the missing bearing component introduces a viscous type of friction corresponding to a viscous coefficient of d=5000 Ns/m. If necessary, it is possible to model other types of friction models, e.g., Coulomb friction. The component responsible for the simulation of an obstacle has two parameters: the fault intensity and the obstacle location. The fault intensity dictates how much opposing force the obstacle generates against the rail motion induced by the motor. Some embodiments model the opposing force as a localized viscous force. The localization of the force was achieved by allowing the viscous coefficient to be non-zero only in a neighborhood of the obstacle location. For example, d can be modeled as $d=10^5\times(\mathbb{1}(x-x_0+\delta)-\mathbb{1}(x-x_0-\delta))$ Ns/m, where $x_0$ is the obstacle location, (x) is the step function and $\delta$ is a small positive scalar. This means that d is non-zero only inside the interval $[x_0-\delta,x_0+\delta]$. The obstacle position is chosen at 10 cm from the left side initial position of the rail. The effects of the fault modes on the motor current and angular velocity for the chosen parameter were shown in FIGS. 7-10. The objective of the fault diagnosis is to detect which of the four fault modes is present by tracking the parameters of the fault modes. Some embodiments consider the single fault scenario that is only one of the four fault modes is active at some time instant. It is possible to use simultaneous parameter tracking (all parameters of the fault model are tracked); alternatively, it is possible to run in parallel tracking algorithm that estimates the parameters of one of the four fault modes only. In one case, there is a four parallel algorithm. Based on the parameter deviation from their nominal values, the presence of a fault mode can be declared.

A. Optimization-Based Parameter Estimation

Some embodiments estimate the fault parameters for each of the four fault modes using an optimization-based parameter estimation algorithm. The loss function was defined as the mean square error (MSE) between the simulated variables and the "observed" variables (motor current, motor angle and angular velocity). The observed variables were generated using the high-fidelity models and contain simulation over a time horizon of 14 seconds containing both switch motions: left to right and right to left. The variables are sampled at 0.1 seconds. The optimization algorithm requires loss function evaluations that in turn requires model simulations. The model simulations were done using Functional Mockup Units (FMU) [T. Blochwitz, M. Otter, M. Arnold, C. Bausch, C. Claus, H. Elmqvist, A. Junghanns, J. Mauss, M. Monteiro, T. Neidhold, D. Neumerkel, H. Olsson, J. v. Peetz, S. Wolf, Atego Systems Gmbh, Qtronic Berlin, Fraunhofer Scai, and St. Augustin. The functional mockup interface for tool independent exchange of simulation models. In In Proceedings of the 8th International Modelica Conference, 2011.] representations of the models. The optimization algorithm was tested for the three versions of the reduced complexity models: causal NN, acausal NN and acausal polynomial representations of the rail. The parameter estimation was tested using several optimization algorithm including gradient-based and gradient-free algorithm. The best results were produced by the differential evolution algorithm and they are presented in what follows. Since such an algorithm requires many loss function evaluations, it is advantageous for the model simulations to be fast. On average, the acausal polynomial, acausal NN and causal NN representations take 0.3 seconds, 0.5 seconds and 0.9 seconds over the 14 sec time horizon. For the same time interval, the high fidelity model takes 7 seconds. The FMUs were used in PYTHON scripts implementing the parameter estimation algorithms. The model simulations were performed on PC with Intel 12 cores Xeon 3.5 GHz CPU with 64 GB of RAM. Recall that the starting position of the rail is 1 m, a value dictated by the initial conditions of the motor and the positions of the different reference points in the rail model.

Left bolt fault: the left bolt fault mode is active with a deviation from its nominal value of 50 mm. Tables IV-VI present the results of the parameter estimation algorithms corresponding to the three representations when tracking the fault parameters separately. Using as metric the MSE, it is clear that the implementations are correctly identifying the left bolt fault as the current fault mode. In addition, the fault parameter values are within 3% of the value used to generate the faulty behavior.

TABLE IV

Left bolt fault mode (acausal polynomial representation)

| Tracked fault parameters | Parameter value | MSE |
|---|---|---|
| Left bolt[mm] | 49.53 | 0.006 |
| Right bolt[mm] | 6.03 | 0.324 |
| Missing bearing[Ns/m] | 39.73 | 0.326 |
| Obstacle{[Ns/m], [m]} | {$1.5 \times 10^5$, 1.49} | 0.334 |

TABLE V

Left bolt fault mode (acausal NN representation)

| Tracked fault parameters | Parameter value | MSE |
|---|---|---|
| Left bolt[mm] | 48.69 | 0.011 |
| Right bolt[mm] | 11.26 | 0.352 |
| Missing bearing[Ns/m] | 28.45 | 0.353 |
| Obstacle{[Ns/m], [m]} | {$1.67 \times 10^5$, 10.04} | 0.386 |

TABLE VI

Left bolt fault mode (causal NN representation)

| Tracked fault parameters | Parameter value | MSE |
|---|---|---|
| Left bolt[mm] | 50.42 | 0.005 |
| Right bolt[mm] | 8.91 | 0.344 |
| Missing bearing[Ns/m] | 33.67 | 0.304 |
| Obstacle{[Ns/m], [m]} | {$6.31 \times 10^4$, 0.0772} | 0.341 |

All the fault parameters were estimated simultaneously as well. The results for the three representations of the rail model are shown in Table VII. Reasonable small MSE values were obtained, but it is more challenging to distinguish between the faults modes. Recalling that the obstacle was introduced at 1.1 m, some embodiments exclude the obstacle fault mode (the fault intensity is irrelevant outside the obstacle position). The parameter corresponding to the missing bearing fault mode has a value in the hundreds for two of the rail representations. Although they may appear not to have a significant impact on the behavior of the rail switch, without some prior information about what is a significant value, it is difficult to draw a conclusion about this fault mode. It is advantageous that that the left bolt fault parameter was reasonably well estimated. Although not zero, the right bolt fault parameter values are small enough to eliminate this fault mode as a possible source of faulty behavior.

TABLE VII

Left bolt fault mode: simultaneous parameter estimation

| Tracked fault parameters | Acausal poly | Acausal NN | Causal NN |
|---|---|---|---|
| Left bolt[mm] | 49.69 | 50.097 | 48.22 |
| Right bolt[mm] | 0.151 | 1.624 | 0.394 |
| Missing bearing[Ns/m] | 244.37 | $1.624 \times 10^2$ | $6.186 \times 10^2$ |

TABLE VII-continued

Left bolt fault mode: simultaneous parameter estimation

| Tracked fault parameters | Acausal poly | Acausal NN | Causal NN |
|---|---|---|---|
| Obstacle{[Ns/m], [m]} | {7.58 × $10^4$, 1.769} | {1.297 × $10^5$, 1.7314} | {1.381 × $10^5$, 1.223} |
| MSE | 0.004 | 0.005 | 0.012 |

Right bolt fault: the bolt fault mode is active with 200 mm deviation from its nominal value. Tables VIII-X present the results of the parameter estimation algorithms corresponding to the three representations when tracking the fault parameters separately. The MSE values show that it is possible to indeed identify the correct fault mode. Moreover, the fault parameter values are within 6% of the value used to generate the faulty behavior.

TABLE VIII

Right bolt fault mode (acausal polynomial representation)

| Tracked fault parameters | Parameter value | MSE |
|---|---|---|
| Left bolt[mm] | 72.75 | 1.025 |
| Right bolt[mm] | 197.35 | 0.029 |
| Missing bearing[Ns/m] | 35.71 | 1.767 |
| Obstacle{[Ns/m], [m]} | {1.11 × $10^5$, 0.191} | 1.786 |

TABLE IX

Right bolt fault mode (acausal NN representation)

| Tracked fault parameters | Parameter value | MSE |
|---|---|---|
| Left bolt[mm] | 71.84 | 1.03 |
| Right bolt[mm] | 187.66 | 0.091 |
| Missing bearing[Ns/m] | 49.12 | 1.818 |
| Obstacle{[Ns/m], [m]} | {6.12 × $10^4$, 1.04} | 1.855 |

TABLE X

Right bolt fault mode (causal NN representation)

| Tracked fault parameters | Parameter value | MSE |
|---|---|---|
| Left bolt[mm] | 73.97 | 1.022 |
| Right bolt[mm] | 198.42 | 0.011 |
| Missing bearing[Ns/m] | 20.20 | 1.792 |
| Obstacle{[Ns/m], [m]} | {1.05 × $10^4$, 0.977} | 1.792 |

Bearing fault: the bearing fault mode is active with the viscous coefficient taking the value 5000 Ns/m. Tables XI-XIII present the results of the parameter estimation algorithms when tracking the fault parameters separately. The smaller MSE values correspond to the bearing fault mode. It should be noted that the parameter estimation error variance is roughly 3%.

TABLE XI

Bearing fault mode (acausal polynomial representation)

| Tracked fault parameters | Parameter value | MSE |
|---|---|---|
| Left bolt[mm] | 0.04 | 0.412 |
| Right bolt[mm] | 4.40 | 0.3869 |
| Missing bearing[Ns/m] | 5060.706 | 0.03 |
| Obstacle{[Ns/m], [m]} | {3.5 × $10^3$, 1.37} | 0.367 |

TABLE XII

Bearing fault mode (acausal NN representation)

| Tracked fault parameters | Parameter value | MSE |
|---|---|---|
| Left bolt[mm] | 0.06 | 0.377 |
| Right bolt[mm] | 16.42 | 0.365 |
| Missing bearing[Ns/m] | 4919.18 | 0.00744 |
| Obstacle{[Ns/m], [m]} | {1.83 × $10^5$, 1.04} | 0.404 |

TABLE XIII

Bearing fault mode (causal NN representation)

| Tracked fault parameters | Parameter value | MSE |
|---|---|---|
| Left bolt[mm] | 0.126 | 0.377 |
| Right bolt[mm] | 5.25 | 0.361 |
| Missing bearing[Ns/m] | 4845.50 | 0.0032 |
| Obstacle{[Ns/m], [m]} | {1.84 × $10^5$, 1.04} | 0.378 |

Obstacle fault: A simulation was performed with the high fidelity model with an obstacle at 1.1 m and a viscous coefficient with the value $10^5$ Ns/m. The parameter estimation results when tracking the fault parameter separately are shown in Tables XIV-XVI. The smallest MSE values were obtained for the correct fault parameters. In addition, the maximum estimation error for the fault intensity and fault location parameters is 0.2% and 0.09% of the nominal values, respectively.

TABLE XIV

Obstacle fault mode (acausal polynomial representation)

| Tracked fault parameters | Parameter value | MSE |
|---|---|---|
| Left bolt[mm] | 3.17 | 69.618 |
| Right bolt[mm] | 49.57 | 69.20 |
| Missing bearing[Ns/m] | 5915.78 | 67.67 |
| Obstacle{[Ns/m], [m]} | {1.01 × $10^5$, 1.099} | 0.020 |

TABLE XV

Obstacle fault mode (acausal NN representation)

| Tracked fault parameters | Parameter value | MSE |
|---|---|---|
| Left bolt[mm] | 0.178 | 69.40 |
| Right bolt[mm] | 44.477 | 69.054 |
| Missing bearing[Ns/m] | 5870.32 | 67.62 |
| Obstacle{[Ns/m], [m]} | {9.98 × $10^4$, 1.099} | 0.047 |

TABLE XVI

Obstacle fault mode (causal NN representation)

| Tracked fault parameters | Parameter value | MSE |
|---|---|---|
| Left bolt[mm] | 0.679 | 69.384 |
| Right bolt[mm] | 54.353 | 69.071 |
| Missing bearing[Ns/m] | 5867.27 | 67.560 |
| Obstacle{[Ns/m], [m]} | (9.98 × $10^4$, 1.099) | 0.0122 |

VIII. CONCLUSIONS

The systems and methods described herein teach a hybrid modeling approach to simplify a high fidelity model of a rail-switch system. In particular, some implementations used simplified representations for the rail component using machine learning inspired models. The representations preserved the physical interpretation of the rail component. The model complexity of the model abstractions (i.e., number of equations) is reduced by two orders of magnitude in some embodiments. A similar reduction in the order of magnitude is obtained with respect to the simulation time of the rail switch model over a full motion cycle of the rail. The new model abstractions were used for the rail fault diagnosis. The rail switch model was augmented with additional behavior to include parameterized fault modes. An optimization based approach was used to estimate the fault parameters. Some implementations demonstrated that using algorithms that track the fault parameters separately of each of the four fault modes produce accurate diagnosis results. The MSEs and the parameter values are used by the diagnosis engine to produce a diagnosis solution.

It will be further appreciated that the techniques disclosed herein may be embodied by a non-transitory storage medium storing instructions readable and executable by an electronic data processing device to perform the disclosed techniques. Such a non-transitory storage medium may comprise a hard drive or other magnetic storage medium, an optical disk or other optical storage medium, a cloud-based storage medium such as a RAID disk array, flash memory or other non-volatile electronic storage medium, or so forth. It will be further appreciated that the techniques disclosed herein may be embodied by one or more processors.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A device comprising:
at least one processor; and
at least one memory including computer program code;
the at least one memory and the computer program code configured to, with the at least one processor, cause the device to:
determine that a component of a first model of a physical system is more complex than other components of the first model;
generate training data from the first model of the physical system;
using the generated training data, design a reduced complexity component for the said component of the first model;
generate a second model of the physical system by replacing the component in the first model with the reduced complexity component;
simulate the physical system using the second model over a predefined time horizon, and update simulation outputs;
use the simulation outputs and compute mean square errors between simulated values of variables of the physical system and observed values of the variables; and
diagnose a fault in the system using computed values of mean square errors.

2. A device comprising:
at least one processor; and
at least one memory including computer program code;
the at least one memory and the computer program code configured to, with the at least one processor, cause the device to:
determine a set of constitutive equations of a physical system, the constitutive equations based on generalized mass spring dampers (gMSD);
solve a constrained optimization problem that is based on the determined set of constitutive equations;
learn a representation of a component of the physical system using a solution of the constrained optimization problem;
evaluate a loss function for the optimization problem using model based simulations using the learned representation of the component;
estimate values of a number of parameters of the physical system using the optimization and simulations; and
determine a fault condition of the physical system if the estimated values of the parameters deviate from their nominal values as indicated by mean square errors (MSE) between those values.

3. The device of claim 2, wherein the at least one memory and the computer program code are further configured to, with the at least one processor, cause the device at least to: impose a dissipativity condition on the component, wherein the dissipativity condition:
(i) ensures that the system can be simulated; and
(ii) is based on an energy of the component.

4. The device of claim 2, wherein the constitutive equations emulate physical laws.

5. The device of claim 2, wherein the constitutive equations are of the form f(x; w)=0, where x includes port variables and internal variables, and w is a vector of parameters of the component.

6. The device of claim 2, wherein the constrained optimization problem is a minimization problem.

7. The device of claim 2, wherein the fault condition is determined based on a mean square error (MSE) of a given parameter.

8. The device of claim 2, wherein the fault condition is determined based on $\|\theta_i - \theta_i^*\| \geq \varepsilon_i$, where:
$\varepsilon_i$ is a fault specific threshold;
$\{\theta_1, \ldots, \theta_L\}$ is a set of fault parameters; and
$\theta_i^*$ are nominal values for $i \in \{1, \ldots, L\}$.

9. The device of claim 2, wherein the system is a rail switch system and the component is a rail.

10. The device of claim 2, wherein:
the system is a rail switch system and the component is a rail; and
the at least one memory and the computer program code are further configured to, with the at least one processor, cause the device to determine the set of constitutive equations further by using force, position, velocity and acceleration as training data.

11. A device comprising:

at least one processor; and at least one memory including computer program code;

the at least one memory and the computer program code configured to, with the at least one processor, cause the device to:

use a causal map to assign causality relations between at least one input variable of a component and at least one output variable of the component in a physical system by:

first, training parameters of the component from training data; and second, fine tuning the parameters of the component by using a model of the physical system, wherein the physical system includes the component;

perform simulations of the physical system using the model and the fine tuned parameters and update simulation outputs;

use the simulation outputs and compute mean square errors between simulated values of variables of the physical system and observed values of the variables; and determine a fault condition of the system using computed values of mean square errors.

12. The device of claim 11, wherein the causal map uses a neural network (NN).

13. The device of claim 11, wherein the fault condition is determined based on a mean square error (MSE) of a given parameter.

14. The device of claim 11, wherein the system is a rail switch system and the component is a rail.

15. The device of claim 11, wherein the system is an electrical system, and the fault condition is one of a short connection and an open connection.

16. The device of claim 11, wherein the system is a mechanical system, and the fault condition is one of a broken flange or a stuck flange.

17. The device of claim 11, wherein the system is a fluid system, and the fault condition is one of a blocked pipe or a leaking pipe.

* * * * *